United States Patent
Sasaki et al.

(10) Patent No.: US 7,557,439 B1
(45) Date of Patent: Jul. 7, 2009

(54) LAYERED CHIP PACKAGE THAT IMPLEMENTS MEMORY DEVICE

(75) Inventors: Yoshitaka Sasaki, Milpitas, CA (US); Hiroyuki Ito, Milpitas, CA (US); Tatsuya Harada, Tokyo (JP); Nobuyuki Okuzawa, Tokyo (JP); Satoru Sueki, Tokyo (JP); Ryuji Hashimoto, Tokyo (JP)

(73) Assignees: TDK Corporation, Tokyo (JP); Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 12/285,101

(22) Filed: Sep. 29, 2008

(51) Int. Cl.
*H01L 23/02* (2006.01)
*H01L 23/48* (2006.01)
*H01L 23/52* (2006.01)
*H01L 29/40* (2006.01)

(52) U.S. Cl. .................. 257/686; 257/777; 257/778; 257/E23.062; 257/E23.063; 257/E23.085; 257/E23.172; 257/E23.173

(58) Field of Classification Search ............ 257/686, 257/777–778, E23.062, E23.063, E23.085, 257/E23.172, E23.173
See application file for complete search history.

(56) References Cited

U.S. PATENT DOCUMENTS

| | | | |
|---|---|---|---|
| 5,838,603 A | 11/1998 | Mori et al. | |
| 5,953,588 A | 9/1999 | Camien et al. | |
| 6,373,447 B1 * | 4/2002 | Rostoker et al. | 343/895 |
| 6,410,983 B1 * | 6/2002 | Moriizumi et al. | 257/723 |
| 7,087,442 B2 * | 8/2006 | Oppermann et al. | 438/15 |
| 7,127,807 B2 | 10/2006 | Yamaguchi et al. | |
| 7,227,249 B1 * | 6/2007 | Chiang | 257/686 |
| 2003/0015781 A1 * | 1/2003 | Farrar | 257/686 |
| 2006/0087013 A1 * | 4/2006 | Hsieh | 257/678 |
| 2007/0023887 A1 | 2/2007 | Matsui | |
| 2007/0257374 A1 * | 11/2007 | Saeki | 257/777 |

OTHER PUBLICATIONS

U.S. Appl. No. 11/878,282; in the name of Sasaki, Yoshitaka et al., filed Jul. 23, 2007.
U.S. Appl. No. 11/896,709; in the name of Sasaki, Yoshitaka et al., filed Sep. 5, 2007.
U.S. Appl. No. 12/213,645; in the name of Sasaki, Yoshitaka et al., filed Jun. 23, 2008.
U.S. Appl. No. 12/216,143; in the name of Sasaki, Yoshitaka et al., filed Jun. 30, 2008.
U.S. Appl. No. 12/216,168; in the name of Sasaki, Yoshitaka et al., filed Jun. 30, 2008.
Gann; "Neo-Stacking Technology;" *HDI Magazine*; Dec. 1999.

* cited by examiner

*Primary Examiner*—Ida M Soward
(74) *Attorney, Agent, or Firm*—Oliff & Berridge, PLC

(57) ABSTRACT

A layered chip package includes a main body, and wiring disposed on a side surface of the main body. The main body includes a plurality of first-type layer portions each including a first-type semiconductor chip; and a second-type layer portion including a second-type semiconductor chip. The first-type semiconductor chip includes a plurality of memory cells. The second-type semiconductor chip includes a control circuit that controls writing and reading on and from the memory cells included in the plurality of first-type layer portions. Each layer portion includes an insulating portion covering at least one side surface of the semiconductor chip, and a plurality of electrodes connected to the semiconductor chip. Each of the electrodes has an end face that is located at the side surface of the main body and connected to the wiring.

12 Claims, 33 Drawing Sheets

LAYERED CHIP PACKAGE THAT IMPLEMENTS MEMORY DEVICE

BACKGROUND OF THE INVENTION

1. Field of the Invention

The present invention relates to a layered chip package that includes a plurality of chips stacked and that implements a memory device, and to an electronic component that includes a layered chip package including a plurality of chips stacked and that implements a memory device.

2. Description of the Related Art

In recent years, a reduction in weight and an improvement in performance have been demanded of mobile devices typified by cellular phones and notebook personal computers. Accordingly, there has been a demand for higher integration of electronic components for use in mobile devices. Higher integration of electronic components has been demanded also for achieving an increase in capacity of semiconductor memory.

As an example of highly integrated electronic components, a system-in-package (hereinafter referred to as SiP), especially an SiP utilizing a three-dimensional packaging technology for stacking a plurality of chips, has attracting attention in recent years. In the present application, a package including a plurality of chips stacked is called a layered chip package. Since the layered chip package allows a reduction in wiring length, it provides the advantage of allowing a higher operation speed for a circuit and a reduction in stray capacitance of wiring, as well as the advantage of allowing higher integration.

Major examples of three-dimensional packaging technology for fabricating a layered chip package include a wire bonding method and a through electrode method. According to the wire bonding method, a plurality of chips are stacked on a substrate and a plurality of electrodes formed on each chip are connected, by wire bonding, to external connecting terminals formed on the substrate. According to the through electrode method, a plurality of through electrodes are formed in each of chips to be stacked and inter-chip wiring is performed through the use of the through electrodes.

The wire bonding method has a problem that it is difficult to reduce the distance between the electrodes so as to avoid contact between wires, and a problem that high resistances of the wires hamper a high-speed operation of a circuit.

The through electrode method is free from the above-mentioned problems of the wire bonding method. Unfortunately, however, the through electrode method requires a large number of steps for forming the through electrodes in chips, and consequently increases the cost for the layered chip package. According to the through electrode method, forming the through electrodes in chips requires a series of steps as follows: forming a plurality of holes for the plurality of through electrodes in a wafer that will be cut later to become a plurality of chips; forming an insulating layer and a seed layer in the plurality of holes and on the top surface of the wafer; forming a plurality of through electrodes by filling the plurality of holes with metal such as Cu by plating; and removing unwanted portions of the seed layer.

According to the through electrode method, the through electrodes are formed by filling metal into holes having relatively high aspect ratios. Consequently, voids or keyholes are prone to occur in the through electrodes due to poor filling of the holes with metal, so that the reliability of wiring using the through electrodes tends to be reduced.

According to the through electrode method, an upper chip and a lower chip are physically joined to each other by connecting the through electrodes of the upper and lower chips by means of, for example, soldering. The through electrode method therefore requires that the upper and lower chips be accurately aligned and then joined to each other at high temperatures. When the upper and lower chips are joined to each other at high temperatures, however, misalignment between the upper and lower chips can occur due to expansion and contraction of the chips, which often results in electrical connection failure between the upper and lower chips.

The through electrode method has a further problem that, if the plurality of chips stacked include one or more defective chips, it is difficult to replace the defective chip(s) with non-defective one(s). In a layered chip package fabricated by the through electrode method, the respective through electrodes of the upper and lower chips are connected to each other by means of, for example, soldering. To remove a defective chip from the layered chip package, it is therefore necessary to melt solder between the defective chip and another chip by heating. This heating also melts solder between non-defective chips, and can thereby cause oxidation or flowing-out of the solder between the non-defective chips. As a result, electrical connection failure can occur between the non-defective chips. For this reason, according to the through electrode method, it is difficult to replace one or more defective chips, if included in the stack of a plurality of chips, with non-defective one(s). This can result in a reduction in yield and an increase in cost for the layered chip package.

U.S. Pat. No. 5,953,588 discloses a method of manufacturing a layered chip package as described below. In this method, a plurality of chips cut out from a processed wafer are embedded into an embedding resin and then a plurality of leads are formed to be connected to each chip, whereby a structure called a neo-wafer is fabricated. Next, the neo-wafer is diced to form a plurality of structures each called a neo-chip. Each neo-chip includes: one or more chips; resin surrounding the chip(s); and a plurality of leads. The plurality of leads connected to each chip each have an end face exposed at a side surface of the neo-chip. Next, a plurality of kinds of neo-chips are laminated into a stack. In the stack, the respective end faces of the plurality of leads connected to the chips of each layer are exposed at the same side surface of the stack.

Keith D. Gann, "Neo-Stacking Technology", HDI Magazine, December 1999, discloses fabricating a stack by the same method as U.S. Pat. No. 5,953,588, and forming wiring on two side surfaces of the stack.

The manufacturing method disclosed in U.S. Pat. No. 5,953,588 involves a number of process steps and this raises the cost for the layered chip package. According to this method, after the plurality of chips cut out from the processed wafer are embedded into the embedding resin, the plurality of leads are formed to be connected to each chip to thereby fabricate the neo-wafer, as described above. Accurate alignment of the plurality of chips is therefore required when fabricating the neo-wafer. This is also a factor that raises the cost for the layered chip package.

U.S. Pat. No. 7,127,807 B2 discloses a multilayer module formed by stacking a plurality of active layers each including a flexible polymer substrate with at least one electronic element and a plurality of electrically-conductive traces formed within the substrate. According to this multilayer module, however, it is impossible to increase the proportion of the area occupied by the electronic element in each active layer, and consequently it is difficult to achieve higher integration.

A memory chip that constitutes a memory device such as a flash memory, DRAM or SRAM will now be considered. A typical memory chip is composed of a semiconductor chip with a plurality of memory cells and a control circuit formed on the semiconductor chip. The control circuit is disposed around the memory cells and controls writing and reading on and from the memory cells. The control circuit is also called a peripheral circuit.

Conventionally, in the case of constructing a large-capacity memory device using a single memory chip, a plurality of memory cell blocks each including a plurality of memory cells are arranged on a plane and the control circuit is provided around the plurality of memory cell blocks. In this case, the plurality of memory cell blocks are connected to each other by thin and long wiring. Accordingly, in this case, the wiring has a high resistance and generates a stray capacitance. The high resistance of the wiring and the stray capacitance generated by the wiring hamper a high-speed operation of the memory device.

To cope with this, a memory device can be constructed by making use of the three-dimensional packaging technology. Known techniques of constructing a memory device by making use of the three-dimensional packaging technology include the following. U.S. Pat. No. 5,838,603 teaches forming a memory cell block and a memory peripheral circuit block on different semiconductor chips, stacking the two chips and connecting them via a solder bump. U.S. Patent Application Publication No. US 2007/0023887 A1 discloses a semiconductor device wherein a plurality of LSI memory chips and a single LSI logic chip are stacked and they are connected via through electrodes.

In the case of constructing a memory device by stacking a plurality of chips and carrying out inter-chip wiring using through electrodes, however, there arise the problems that it is not easy to form wiring using through electrodes and the reliability of the wiring formed using through electrodes tends to be reduced, as described previously. In the case of constructing a large-capacity memory device, in particular, these problems become more significant because of the complexity of wiring.

OBJECT AND SUMMARY OF THE INVENTION

It is a first object of the present invention to provide a layered chip package that includes a plurality of chips stacked and that implements a memory device, the layered chip package allowing easy formation of wiring for establishing electrical connection between the chips and being capable of increasing the reliability of the wiring.

It is a second object of the present invention to provide an electronic component that includes a layered chip package including a plurality of chips stacked and that implements a memory device, the electronic component allowing easy formation of wiring for establishing electrical connection between the chips and being capable of increasing the reliability of the wiring.

A layered chip package of the present invention includes: a main body having a top surface, a bottom surface and four side surfaces; and wiring disposed on at least one of the side surfaces of the main body. The main body includes a plurality of layer portions stacked. The plurality of layer portions include: a plurality of first-type layer portions each including a first-type semiconductor chip; and a second-type layer portion including a second-type semiconductor chip. The first-type semiconductor chip includes a plurality of memory cells. The second-type semiconductor chip includes a circuit that controls writing and reading on and from the plurality of memory cells included in the plurality of first-type layer portions. Each of the first-type semiconductor chip and the second-type semiconductor chip has a top surface, a bottom surface and four side surfaces. Each of the plurality of layer portions includes: an insulating portion covering at least one of the four side surfaces of the first-type or second-type semiconductor chip; and a plurality of electrodes connected to the first-type or second-type semiconductor chip. The insulating portion has at least one end face located at the at least one of the side surfaces of the main body on which the wiring is disposed. Each of the plurality of electrodes has an end face surrounded by the insulating portion and located at the at least one of the side surfaces of the main body on which the wiring is disposed. The wiring is connected to the end faces of the plurality of electrodes of the plurality of layer portions.

In the layered chip package of the present invention, the first-type semiconductor chip may further include a circuit relating only to the plurality of memory cells included therein.

The layered chip package of the present invention may further include a plurality of terminals disposed on at least one of the top surface and the bottom surface of the main body and connected to the wiring.

In the layered chip package of the present invention, the four side surfaces of the main body may include at least one first-type side surface on which the wiring is disposed, and at least one second-type side surface on which the wiring is not disposed. In this case, the four side surfaces of the first-type or second-type semiconductor chip may include at least one first-type side surface having the insulating portion between itself and the at least one first-type side surface of the main body, and at least one second-type side surface located at the at least one second-type side surface of the main body.

A first electronic component of the present invention includes a layered chip package, and a circuit layer bonded to the layered chip package. The layered chip package includes: a main body having a top surface, a bottom surface and four side surfaces; and wiring disposed on at least one of the side surfaces of the main body. The main body includes a plurality of layer portions stacked. Each of the plurality of layer portions includes: a semiconductor chip having a top surface, a bottom surface and four side surfaces and including a plurality of memory cells; an insulating portion covering at least one of the four side surfaces of the semiconductor chip; and a plurality of electrodes connected to the semiconductor chip. The insulating portion has at least one end face located at the at least one of the side surfaces of the main body on which the wiring is disposed. Each of the plurality of electrodes has an end face surrounded by the insulating portion and located at the at least one of the side surfaces of the main body on which the wiring is disposed. The wiring is connected to the end faces of the plurality of electrodes of the plurality of layer portions. The circuit layer includes a circuit that is connected to the wiring of the layered chip package and that controls writing and reading on and from the plurality of memory cells included in the plurality of layer portions.

In the first electronic component of the present invention, the semiconductor chip may further include a circuit relating only to the plurality of memory cells included therein.

In the first electronic component of the present invention, the layered chip package may further include a plurality of terminals disposed on at least one of the top surface and the bottom surface of the main body and connected to the wiring. In this case, the circuit layer may be connected to the plurality of terminals.

In the first electronic component of the present invention, the four side surfaces of the main body may include at least one first-type side surface on which the wiring is disposed, and at least one second-type side surface on which the wiring is not disposed. In this case, the four side surfaces of the semiconductor chip may include at least one first-type side surface having the insulating portion between itself and the at least one first-type side surface of the main body, and at least one second-type side surface located at the at least one second-type side surface of the main body.

A second electronic component of the present invention includes: a plurality of layered chip packages stacked; and a circuit layer bonded to and electrically connected to one of the plurality of layered chip packages. Every vertically adjacent two of the layered chip packages are electrically connected to each other. Each of the plurality of layered chip packages includes: a main body having a top surface, a bottom surface and four side surfaces; and wiring disposed on at least one of the side surfaces of the main body. The main body includes a plurality of layer portions stacked. Each of the plurality of layer portions includes: a semiconductor chip having a top surface, a bottom surface and four side surfaces and including a plurality of memory cells; an insulating portion covering at least one of the four side surfaces of the semiconductor chip; and a plurality of electrodes connected to the semiconductor chip. The insulating portion has at least one end face located at the at least one of the side surfaces of the main body on which the wiring is disposed. Each of the plurality of electrodes has an end face surrounded by the insulating portion and located at the at least one of the side surfaces of the main body on which the wiring is disposed. The wiring is connected to the end faces of the plurality of electrodes of the plurality of layer portions. The circuit layer includes a circuit that controls writing and reading on and from the plurality of memory cells included in the plurality of layered chip packages.

In the second electronic component of the present invention, the semiconductor chip may further include a circuit relating only to the plurality of memory cells included therein.

In the second electronic component of the present invention, each of the plurality of layered chip packages may further include: a plurality of first terminals disposed on the top surface of the main body and connected to the wiring; and a plurality of second terminals disposed on the bottom surface of the main body and connected to the wiring. In this case, in every vertically adjacent two of the layered chip packages, the plurality of first terminals of the lower one of the layered chip packages may be electrically connected to the plurality of second terminals of the upper one of the layered chip packages.

In the second electronic component of the present invention, the four side surfaces of the main body may include at least one first-type side surface on which the wiring is disposed, and at least one second-type side surface on which the wiring is not disposed. In this case, the four side surfaces of the semiconductor chip may include at least one first-type side surface having the insulating portion between itself and the at least one first-type side surface of the main body, and at least one second-type side surface located at the at least one second-type side surface of the main body.

According to the layered chip package of the present invention or the first or second electronic component of the present invention, the wiring disposed on at least one of the side surfaces of the main body serves to establish electrical connection between the plurality of chips stacked. Consequently, it is possible to easily form wiring for establishing electrical connection between chips and to increase the reliability of the wiring.

Other and further objects, features and advantages of the invention will appear more fully from the following description.

DETAILED DESCRIPTION OF THE PREFERRED EMBODIMENTS

First Embodiment

Figure 1:
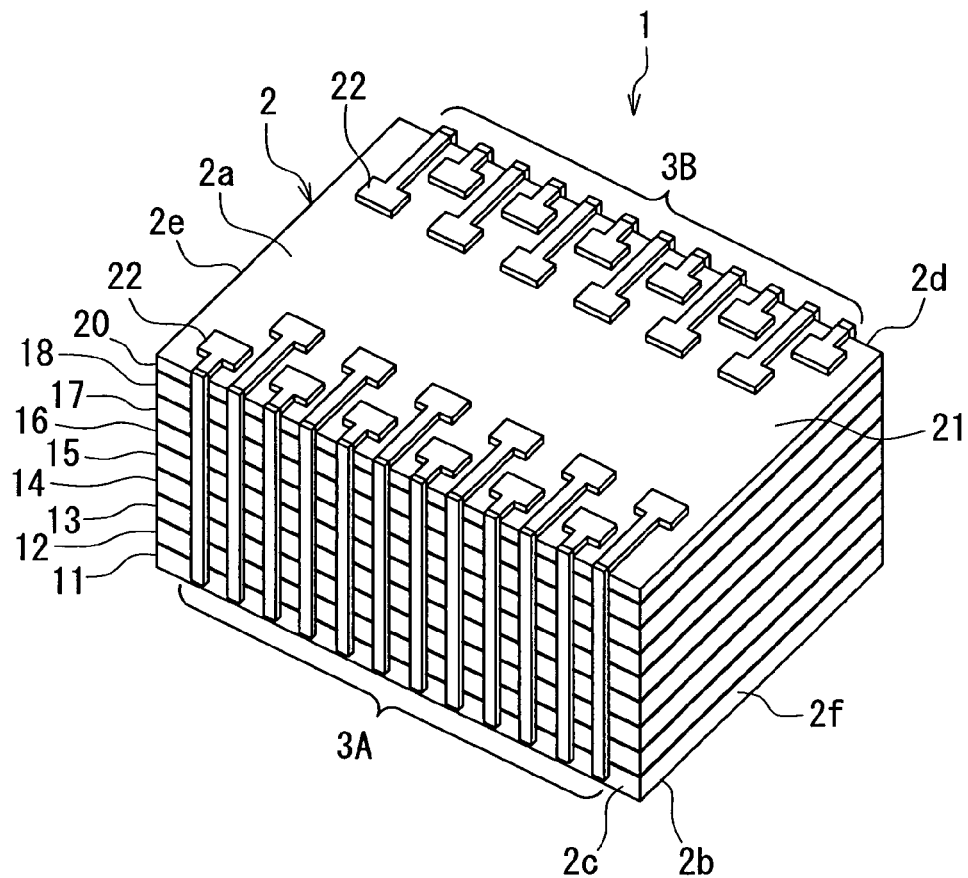
FIG. 1 is a perspective view of a layered chip package of a first embodiment of the invention.

Embodiments of the present invention will now be described in detail with reference to the drawings. Reference is first made to FIG. 1 to describe the configuration of a layered chip package of a first embodiment of the invention. FIG. 1 is a perspective view of the layered chip package of the first embodiment. As shown in FIG. 1, the layered chip package 1 of the first embodiment includes a main body 2 that is rectangular-solid-shaped. The main body 2 has a top surface 2a, a bottom surface 2b, a first side surface 2c and a second side surface 2d facing toward opposite directions, and a third side surface 2e and a fourth side surface 2f facing toward opposite directions.

The layered chip package 1 further includes wiring disposed on at least one of the side surfaces of the main body 2. In the example shown in FIG. 1, the layered chip package 1 includes first wiring 3A disposed on the first side surface 2c of the main body 2, and second wiring 3B disposed on the second side surface 2d of the main body 2. Hereinafter, any wiring is represented by reference numeral 3.

The main body 2 includes a plurality of layer portions stacked. By way of example, FIG. 1 shows that the main body 2 includes eight layer portions 11, 12, 13, 14, 15, 16, 17 and 18 that are stacked in this order from the bottom. The number of the layer portions to be included in the main body 2 is not limited to eight, and may be any plural number. In the following description, any layer portion is represented by reference numeral 10.

The main body 2 further includes a terminal layer 20 laid on the uppermost layer portion 18. Every vertically adjacent two of the layer portions are bonded to each other with an adhesive, and so are the layer portion 18 and the terminal layer 20 to each other. The layer portions 11 to 18 and the terminal layer 20 each have a top surface, a bottom surface, and four side surfaces. The terminal layer 20 includes a terminal layer main body 21 having a top surface and a bottom surface, and a plurality of pad-shaped terminals 22 disposed on the top surface of the terminal layer main body 21. The plurality of pad-shaped terminals 22 function as external connecting terminals of the layered chip package 1. Some of the pad-shaped terminals 22 each have an end face located at the side surface 2c of the main body 2, and the first wiring 3A is connected to this end face. Other some of the pad-shaped terminals 22 each have an end face located at the side surface 2d of the main body 2, and the second wiring 3B is connected to this end face.

The layered chip package 1 may further include an overcoat layer that is formed of an insulating material such as a resin and that covers the top surface 2a of the main body 2 and the plurality of pad-shaped terminals 22. In this case, the overcoat layer is provided with a plurality of openings for exposing respective portions of the pad-shaped terminals 22.

Figure 2:
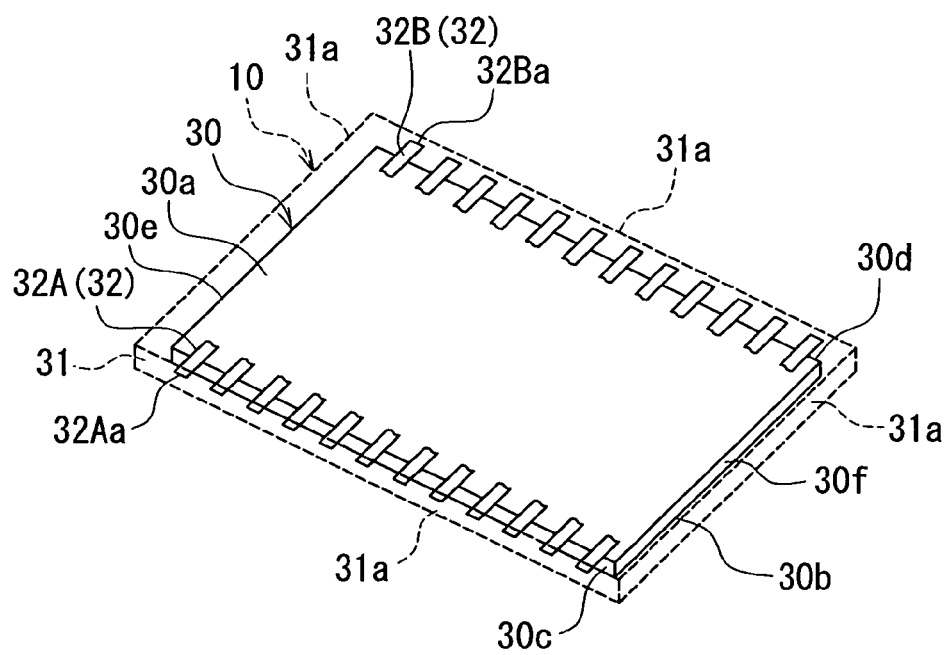
FIG. 2 is a perspective view of one of layer portions included in the layered chip package of FIG. 1.

FIG. 2 is a perspective view of one layer portion 10. As shown in FIG. 2, the layer portion 10 includes a semiconductor chip 30. The semiconductor chip 30 has a top surface 30a, a bottom surface 30b, a first side surface 30c and a second side surface 30d facing toward opposite directions, and a third side surface 30e and a fourth side surface 30f facing toward opposite directions. The side surfaces 30c, 30d, 30e and 30f respectively face toward the side surfaces 2c, 2d, 2e and 2f of the main body 2.

The layer portion 10 further includes: an insulating portion 31 covering at least one of the four side surfaces of the semiconductor chip 30; and a plurality of electrodes 32 connected to the semiconductor chip 30. The insulating portion 31 has at least one end face 31a located at the at least one of the side surfaces of the main body 2 on which the wiring is disposed. In the example shown in FIG. 2, the insulating portion 31 covers all of the four side surfaces of the semiconductor chip 30, and has four end faces 31a that are respectively located at the four side surfaces of the main body 2. In this example, the insulating portion 31 further covers the top surface 30a of the semiconductor chip 30.

In the example shown in FIG. 2, the plurality of electrodes 32 include a plurality of first electrodes 32A and a plurality of second electrodes 32B. Each of the plurality of first electrodes 32A has an end face 32Aa that is located at the first side surface 2c of the main body 2 and surrounded by the insulating portion 31. Each of the plurality of second electrodes 32B has an end face 32Ba that is located at the second side surface 2d of the main body 2 and surrounded by the insulating portion 31. The first wiring 3A disposed on the first side surface 2c of the main body 2 is connected to the end faces 32Aa of the plurality of first electrodes 32A of a plurality of layer portions 10. The second wiring 3B disposed on the second side surface 2d of the main body 2 is connected to the end faces 32Ba of the plurality of second electrodes 32B of the plurality of layer portions 10. In the following description, any electrode is represented by reference numeral 32, and the end face of any electrode 32 is represented by reference numeral 32a.

The layered chip package 1 implements a memory device such as a flash memory, DRAM, SRAM, MRAM, PROM or FeRAM. The plurality of layer portions 10 include: a plurality of first-type layer portions each including a first-type semiconductor chip 30; and at least one second-type layer portion including a second-type semiconductor chip 30. The first-type semiconductor chip 30 includes a plurality of memory cells. The second-type semiconductor chip 30 includes a control circuit that controls writing and reading on and from the plurality of memory cells included in the plurality of first-type layer portions. Here, by way of example, the layer portion 11 is the second-type layer portion, while the other layer portions 12 to 18 are the first-type layer portions.

The control circuit included in the second-type semiconductor chip 30 specifically includes a column address buffer, a row address buffer, a column decoder, a row decoder, a sense amplifier, a verify circuit, a redundancy circuit, a clock generation circuit, etc.

The first-type semiconductor chip 30 may include, in addition to the plurality of memory cells, a circuit relating only to the plurality of memory cells included therein. For example, the first-type semiconductor chip 30 may include a column decoder, a row decoder, a sense amplifier, a verify circuit, a redundancy circuit, etc. that relate only to the memory cells included therein. However, a circuit relating to a plurality of groups of memory cells included in a plurality of first-type semiconductor chips 30 is included in the second-type semiconductor chip 30.

Figure 3:
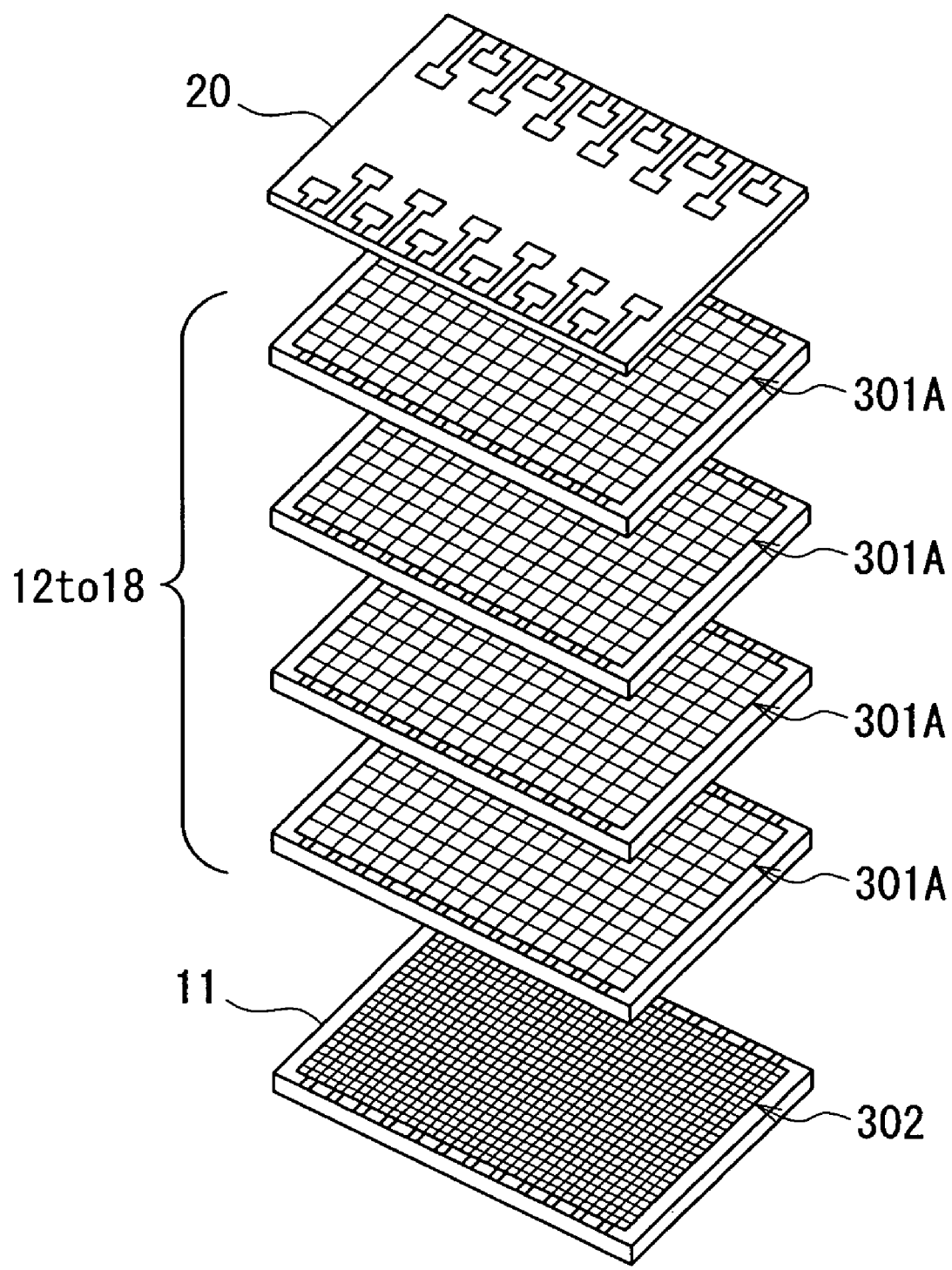
FIG. 3 is an exploded perspective view showing an example of a plurality of layer portions constituting the layered chip package of FIG. 1.

FIG. 3 is an exploded perspective view showing an example of the plurality of layer portions constituting the layered chip package of FIG. 1. Some of the layer portions 12 to 18 are omitted in FIG. 3. In the example shown in FIG. 3, the first-type semiconductor chip 30 included in each of the layer portions 12 to 18, which are the first-type layer portions, includes a memory cell section 301A composed of a plurality of memory cells, and does not include any other circuit. The second-type semiconductor chip 30 included in the layer portion 11, which is the second-type layer portion, includes the control circuit 302.

Figure 4:
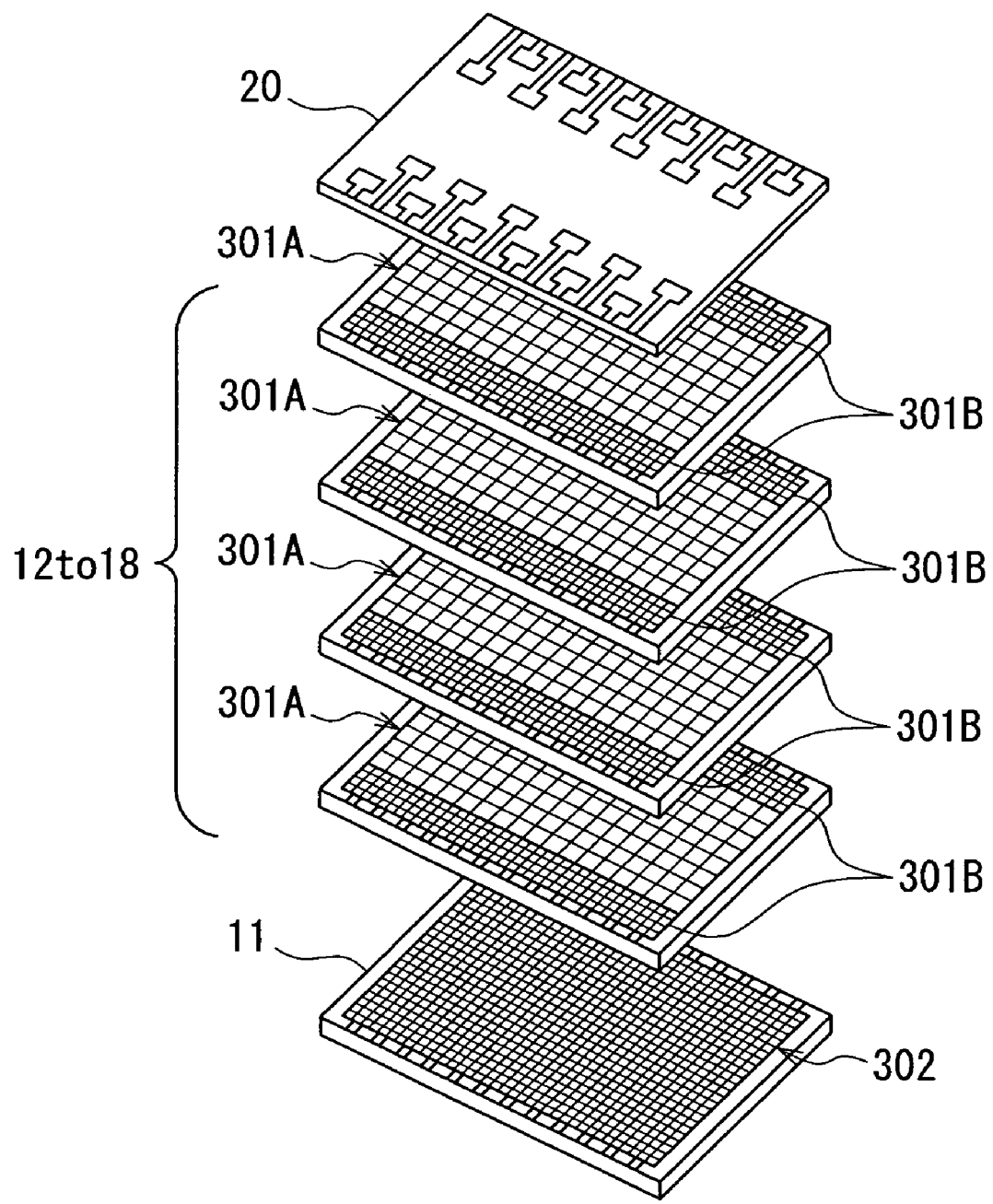
FIG. 4 is an exploded perspective view showing another example of a plurality of layer portions constituting the layered chip package of FIG. 1.

FIG. 4 is an exploded perspective view showing another example of the plurality of layer portions constituting the layered chip package of FIG. 1. Some of the layer portions 12 to 18 are omitted in FIG. 4. In the example shown in FIG. 4, the first-type semiconductor chip 30 included in each of the layer portions 12 to 18, which are the first-type layer portions, includes the memory cell section 301A composed of a plurality of memory cells, and a circuit 301B relating only to the plurality of memory cells included in the memory cell section 301A. The second-type semiconductor chip 30 included in the layer portion 11, which is the second-type layer portion, includes the control circuit 302.

In the layered chip package 1 of the present embodiment, the plurality of semiconductor chips 30 included in the plurality of layer portions 10 are electrically connected to each other by the wiring 3, whereby a memory device is implemented.

Since the layered chip package 1 of the present embodiment includes a plurality of first-type semiconductor chips 30 each of which includes a plurality of memory cells, the layered chip package 1 is capable of implementing a large-capacity memory device. Furthermore, according to the layered chip package 1, it is possible to easily implement memory devices of various capacities such as 64 GB (gigabytes), 128 GB and 256 GB by changing the number of the first-type semiconductor chips 30 included in the layered chip package 1.

A manufacturing method for the layered chip package 1 of the present embodiment will now be described. The manufacturing method for the layered chip package 1 of the present embodiment includes the steps of: fabricating a layered substructure; and fabricating a plurality of layered chip packages 1 by using the layered substructure. In the step of fabricating the layered substructure, the layered substructure is fabricated by stacking a plurality of substructures in correspondence with the order of stacking of the plurality of layer portions 10 of the layered chip package 1. The plurality of substructures respectively correspond to the plurality of layer portions 10 of the layered chip package 1. Each substructure includes a plurality of its corresponding layer portions 10 and will be cut later at a boundary between every adjacent ones of the plurality of its corresponding layer portions 10. The plurality of substructures may each include a plurality of layer portions 10 of the same type.

With reference to FIG. 5 to FIG. 21, a detailed description will now be made on the step of fabricating the layered substructure in the manufacturing method for the layered chip package 1 of the present embodiment. In the step of fabricating the layered substructure, first, a plurality of pre-substructure wafers that respectively correspond to the plurality of layer portions 10 of the layered chip package 1 are fabricated.

Figure 5:
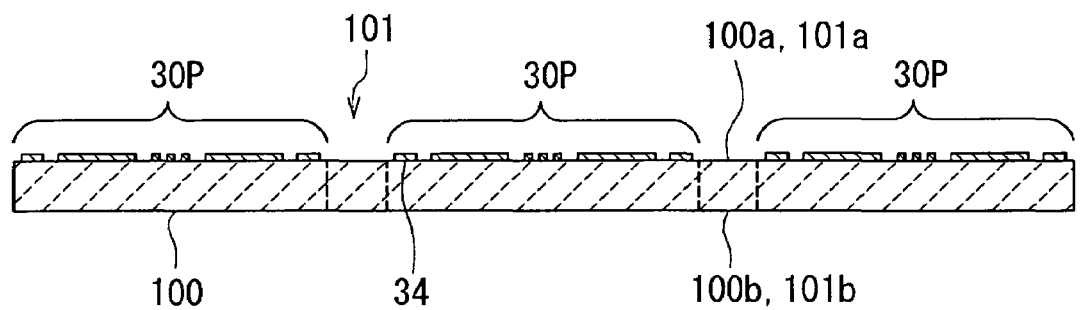
FIG. 5 is a cross-sectional view of a portion of a pre-substructure wafer fabricated in a step of a manufacturing method for the layered chip package of the first embodiment of the invention.

FIG. 5 shows a step of fabricating a single pre-substructure wafer. In this step, a semiconductor wafer 100 having a first surface 100a and a second surface 100b that face toward opposite directions is subjected to processing, such as a wafer process, at the first surface 100a, to thereby fabricate a pre-substructure wafer 101 that includes a plurality of pre-semiconductor-chip portions 30P aligned. The plurality of pre-semiconductor-chip portions 30P each include a device, and are to become the plurality of semiconductor chips 30 later. The plurality of pre-semiconductor-chip portions 30P of the pre-substructure wafer 101 may later become a plurality of the same type of semiconductor chips 30. The pre-substructure wafer 101 has a first surface 101a corresponding to the first surface 100a of the semiconductor wafer 100, and a second surface 101b corresponding to the second surface 100b of the semiconductor wafer 100. In the pre-substructure wafer 101, the plurality of pre-semiconductor-chip portions 30P may be aligned in a row, or may be aligned in a plurality of rows such that a plurality of ones of the pre-semiconductor-chip portions 30P are aligned in each of vertical and horizontal directions. In the following description, it is assumed that the plurality of pre-semiconductor-chip portions 30P are aligned in a plurality of rows such that a plurality of ones of the pre-semiconductor-chip portions 30P are aligned in each of vertical and horizontal directions in the pre-substructure wafer 101.

The semiconductor wafer 100 may be a silicon wafer, for example. The wafer process is a process in which a wafer is processed into a plurality of devices that are not yet separated into a plurality of chips. In the pre-substructure wafer 101, the first surface 101a is a device formation surface on which devices are formed. Each of the plurality of pre-semiconductor-chip portions 30P has a plurality of pad-shaped electrodes 34 disposed on the first surface 101a of the pre-substructure wafer 101.

Figure 14:
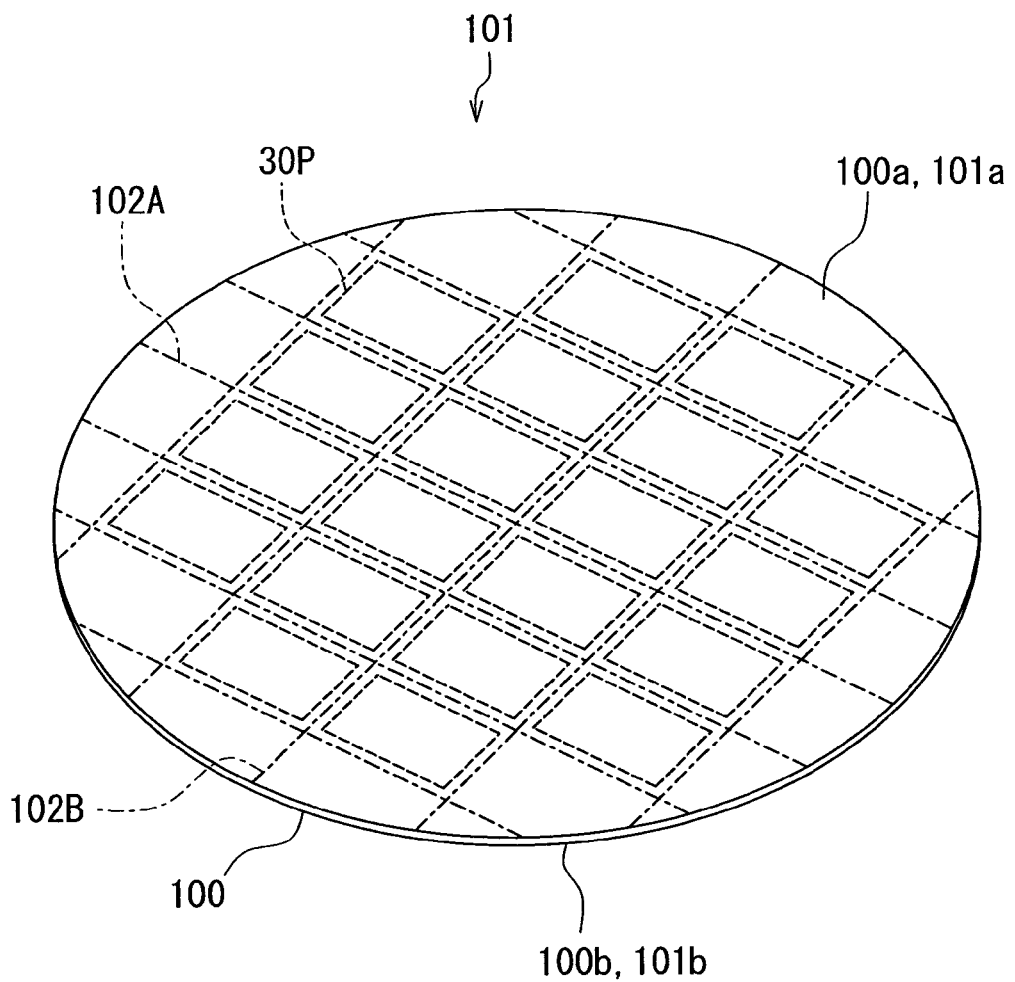
FIG. 14 is a perspective view of the pre-substructure wafer fabricated in the step of FIG. 5.

FIG. 14 is a perspective view of the pre-substructure wafer 101. As shown in FIG. 14, the pre-substructure wafer 101 is provided with a plurality of scribe lines 102A and a plurality of scribe lines 102B. The scribe lines 102A extend horizontally to pass through boundaries between every two pre-semiconductor-chip portions 30P that are vertically adjacent to each other. The scribe lines 102B extend vertically to pass through boundaries between every two pre-semiconductor-chip portions 30P that are horizontally adjacent to each other.

Figure 15:
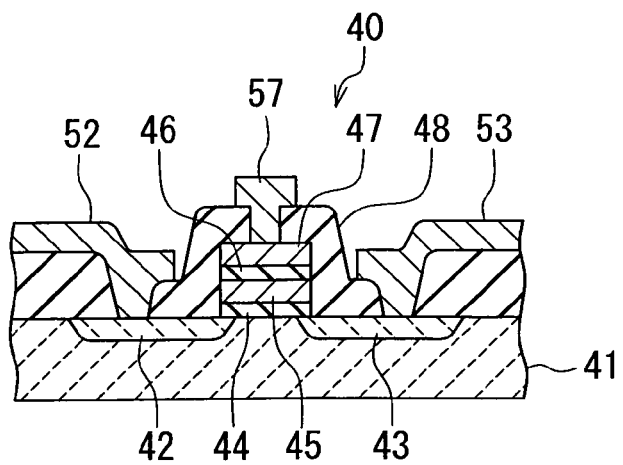
FIG. 15 is a cross-sectional view showing an example of the internal structure of a pre-semiconductor-chip portion of the pre-substructure wafer of FIG. 14.

FIG. 15 is a cross-sectional view illustrating an example of the internal structure of each pre-semiconductor-chip portion 30P of the pre-substructure wafer 101 of FIG. 14. Here is given an example in which a plurality of memory cells of a flash memory are formed as a device in the pre-semiconductor-chip portion 30P. FIG. 15 shows one of the plurality of memory cells as a device formed in the pre-semiconductor-chip portion 30P. The memory cell 40 includes a source 42 and a drain 43 formed near a surface of a P-type silicon substrate 41 composed of the semiconductor wafer 100, i.e., near the first surface 100a of the semiconductor wafer 100. The source 42 and the drain 43 are both N-type regions. The source 42 and the drain 43 are disposed at a predetermined distance from each other so that a channel composed of a portion of the P-type silicon substrate 41 is provided between the source 42 and the drain 43. The memory cell 40 further includes an insulating film 44, a floating gate 45, an insulating film 46 and a control gate 47 that are stacked in this order on the surface of the substrate 41 at the location between the source 42 and the drain 43. The memory cell 40 further includes an insulating layer 48 covering the source 42, the drain 43, the insulating film 44, the floating gate 45, the insulating film 46 and the control gate 47. The insulating layer 48 has contact holes that open at the tops of the source 42, the drain 43 and the control gate 47, respectively. The memory cell 40 includes a source electrode 52, a drain electrode 53, and a control gate electrode 57 that are formed on the insulating layer 48 at locations above the source 42, the drain 43 and the control gate 47, respectively. The source electrode 52, the drain electrode 53 and the control gate electrode 57 are connected to the source 42, the drain 43 and the control gate 47, respectively, through the respective contact holes.

A plurality of pre-substructure wafers 101 that respectively correspond to the plurality of layer portions 10 of the layered chip package 1 are each fabricated through the step described with reference to FIG. 5.

Figure 6:
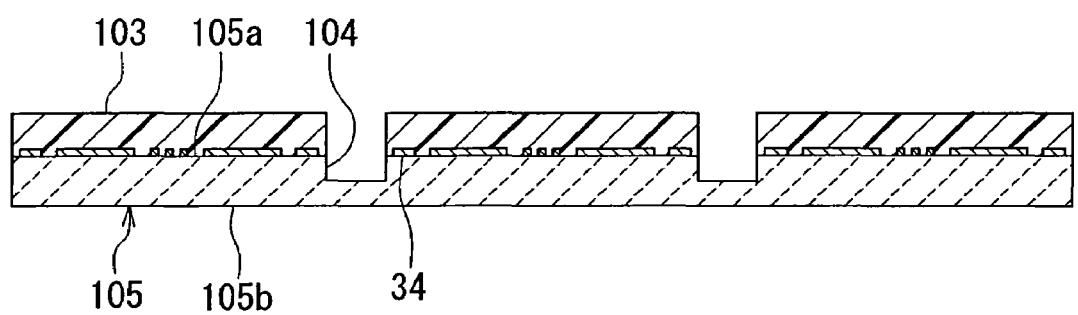
FIG. 6 is a cross-sectional view of a portion of a pre-polishing substructure main body fabricated in a step that follows the step of FIG. 5.

FIG. 6 shows a step that follows the step of FIG. 5. In this step, first, a protection film 103 made of, for example, photoresist, is formed to cover the entire first surface 101a of the pre-substructure wafer 101. Next, at least one groove 104 is formed in the pre-substructure wafer 101. The at least one groove 104 opens at the first surface 101a of the pre-substructure wafer 101 and extends to be adjacent to at least one of the pre-semiconductor-chip portions 30P. Here, a plurality of grooves 104 are formed as shown in FIG. 6. At the positions of the boundaries between every two adjacent pre-semiconductor-chip portions 30P, the grooves 104 are formed to pass through the boundaries between every two adjacent pre-semiconductor-chip portions 30P. In this way, a pre-polishing substructure main body 105 is formed by the pre-substructure wafer 101 having undergone the formation of the plurality of grooves 104 therein. The pre-polishing substructure main body 105 includes the plurality of pre-semiconductor-chip portions 30P. The pre-polishing substructure main body 105 has a first surface 105a and a second surface 105b. The first surface 105a corresponds to the first surface 100a of the semiconductor wafer 100 and the first surface 101a of the pre-substructure wafer 101. The second surface 105b corresponds to the second surface 100b of the semiconductor wafer 100 and the second surface 101b of the pre-substructure wafer 101. The pre-polishing substructure main body 105 further has the plurality of grooves 104 that open at the first surface 105a. In the pre-polishing substructure main body 105, the first surface 105a is a device formation surface on which devices are formed.

The plurality of grooves 104 are formed along the scribe lines 102A and 102B shown in FIG. 14. The grooves 104 are formed such that their bottoms do not reach the second surface 101b of the pre-substructure wafer 101. The grooves 104 are each 10 to 150 μm wide, for example. The grooves 104 are each 30 to 150 μm deep, for example. The grooves 104 may be formed using a dicing saw, or by etching such as reactive ion etching.

Figure 16:
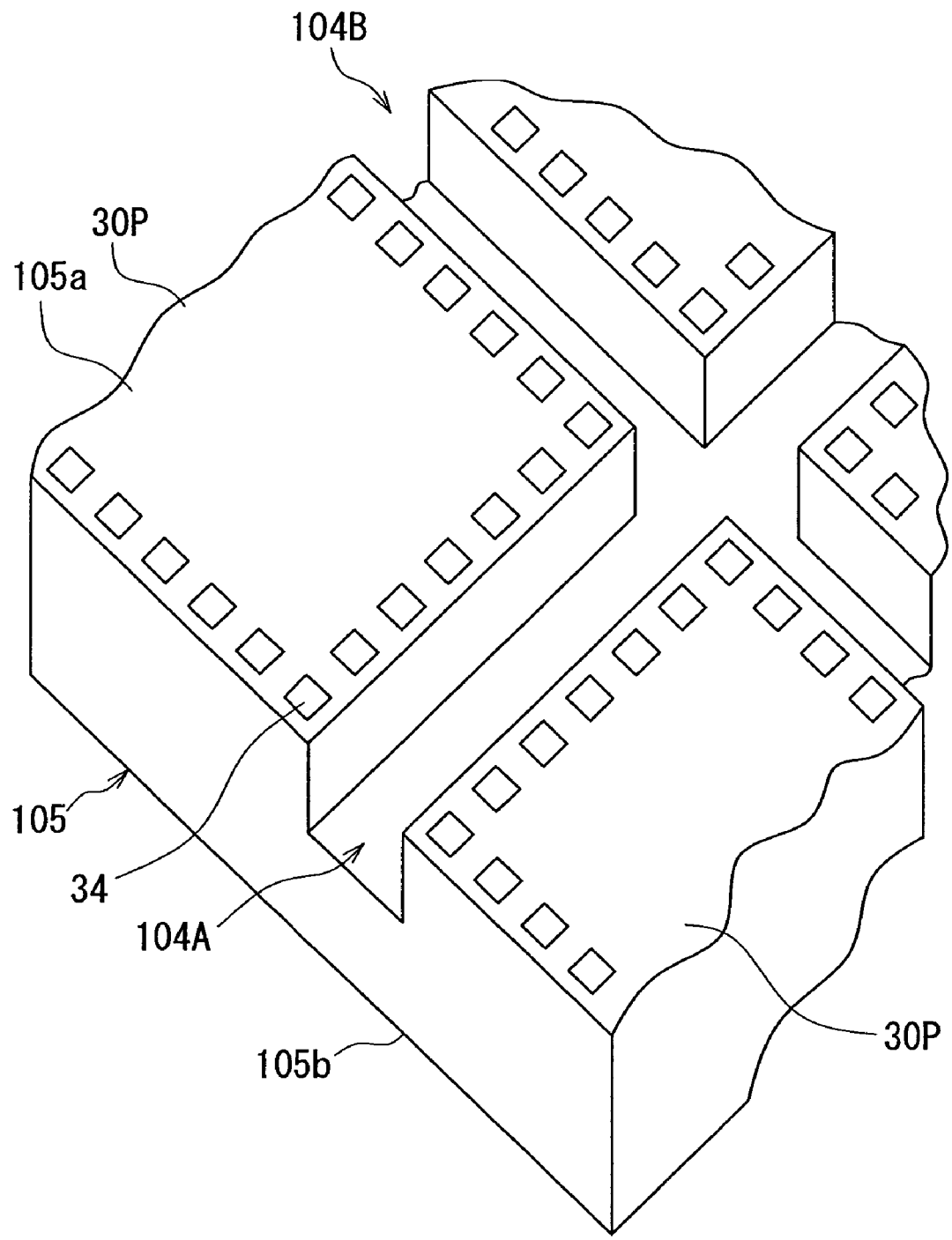
FIG. 16 is a perspective view of a portion of the pre-polishing substructure main body fabricated in the step of FIG. 6.

FIG. 16 shows a portion of the pre-polishing substructure main body 105 fabricated in the step of FIG. 6. In the present embodiment, the plurality of grooves 104 include a plurality of first grooves 104A and a plurality of second grooves 104B. The first grooves 104A and the second grooves 104B extend in directions orthogonal to each other. FIG. 16 shows only one each of the first and second grooves 104A and 104B. The first grooves 104A are formed along the scribe lines 102A shown in FIG. 14, and the second grooves 104B are formed along the scribe lines 102B shown in FIG. 14.

Figure 7:
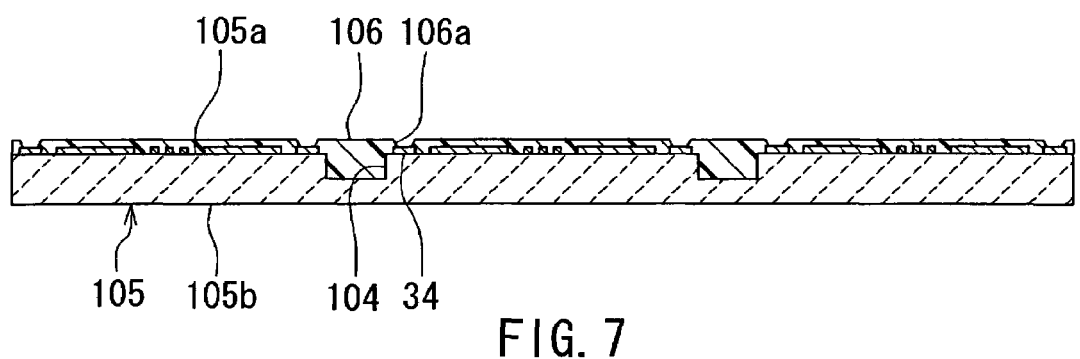
FIG. 7 is a cross-sectional view of a portion of a structure fabricated in a step that follows the step of FIG. 6.

FIG. 7 shows a step that follows the step of FIG. 6. In this step, first, an insulating layer 106 is formed to fill the plurality of grooves 104 of the pre-polishing substructure main body 105 and to cover the plurality of pad-shaped electrodes 34. The insulating layer 106 will later become part of the insulating portion 31. Next, a plurality of openings 106a for exposing the pad-shaped electrodes 34 are formed in the insulating layer 106.

The insulating layer 106 may be formed of a resin such as an epoxy resin or a polyimide resin. The insulating layer 106 may also be formed of a photosensitive material such as a polyimide resin containing a sensitizer. If the insulating layer 106 is formed of a photosensitive material, the openings 106a of the insulating layer 106 may be formed by photolithography. If the insulating layer 106 is formed of a non-photosensitive material, the openings 106a of the insulating layer 106 may be formed by selectively etching the insulating layer 106.

The insulating layer 106 may include a first layer that fills the grooves 104, and a second layer that covers the first layer and the pad-shaped electrodes 34. In this case, the openings 106a are formed in the second layer. Both of the first layer and the second layer may be formed of a resin such as an epoxy resin or a polyimide resin. The second layer may be formed of a photosensitive material such as a polyimide resin containing a sensitizer. If the second layer is formed of a photosensitive material, the openings 106a may be formed in the second layer by photolithography. If the second layer is formed of a non-photosensitive material, the openings 106a may be formed in the second layer by selectively etching the second layer.

It is preferable that the insulating layer 106 be formed of a resin having a low thermal expansion coefficient. Forming the insulating layer 106 of a resin having a low thermal expansion coefficient serves to facilitate cutting of the insulating layer 106 when the insulating layer 106 is cut later with a dicing saw.

It is preferable that the insulating layer 106 be transparent. If the insulating layer 106 is transparent, it is possible to easily recognize alignment marks that will be formed on the insulating layer 106 later, through the insulating layer 106.

Figure 8:
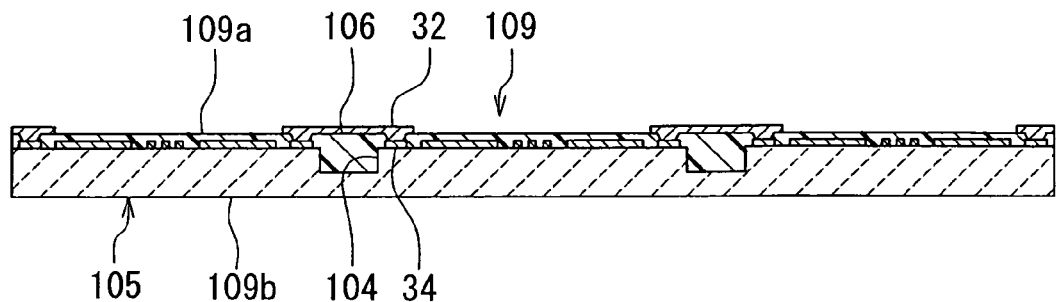
FIG. 8 is a cross-sectional view of a portion of a pre-polishing substructure fabricated in a step that follows the step of FIG. 7.
Figure 17:
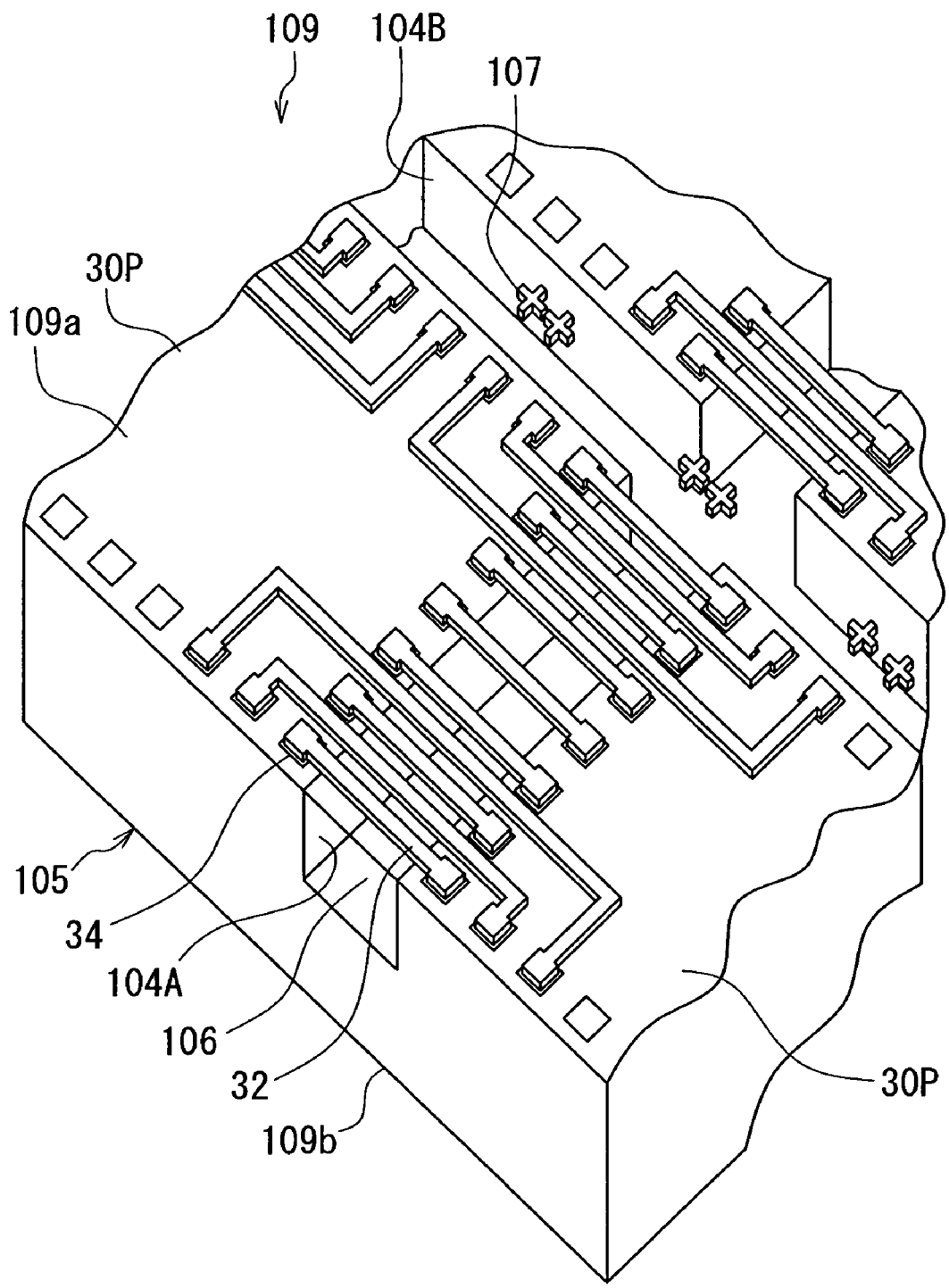
FIG. 17 is a perspective view of a portion of the pre-polishing substructure fabricated in the step of FIG. 8.

FIG. 8 shows a step that follows the step of FIG. 7. In this step, the plurality of electrodes 32 are formed such that part of each of the electrodes 32 lies on the insulating layer 106. The electrodes 32 are connected to the pad-shaped electrodes 34 through the openings 106a. FIG. 17 shows a portion of the structure fabricated in the step of FIG. 8. FIG. 8 and FIG. 17 show an example in which electrodes 32 extending from one of two adjacent pre-semiconductor-chip portions 30P are coupled to those extending from the other of the two adjacent pre-semiconductor-chip portions 30P. However, it is not necessarily required that electrodes 32 extending from one of two adjacent pre-semiconductor-chip portions 30P be coupled to those extending from the other of the two adjacent pre-semiconductor-chip portions 30P.

The electrodes 32 are formed of a conductive material such as Cu. The electrodes 32 are formed by frame plating, for example. In this case, first, a seed layer for plating is formed on the insulating layer 106. Next, a frame having grooves is formed on the seed layer. The frame is formed by patterning a photoresist layer by photolithography, for example. Next, plating layers to become part of the electrodes 32 are formed by plating on the seed layer in the grooves of the frame. Next, the frame is removed and the seed layer except portions thereof located below the plating layers is also removed by etching. As a result, the electrodes 32 are formed of the plating layers and the portions of the seed layer remaining therebelow.

As shown in FIG. 17, in the step of forming the plurality of electrodes 32, a plurality of alignment marks 107 are formed on the insulating layer 106 simultaneously with the formation of the plurality of electrodes 32. The alignment marks 107 are disposed above the grooves 104. The material and forming method of the alignment marks 107 are the same as those of the electrodes 32.

A pre-polishing substructure 109 shown in FIG. 8 and FIG. 17 is thus fabricated. The pre-polishing substructure 109 includes: the pre-polishing substructure main body 105; the insulating layer 106 that fills the grooves 104 of the pre-polishing substructure main body 105 and that will later become part of the insulating portion 31; the plurality of electrodes 32 each having a portion lying on the insulating layer 106; and the plurality of alignment marks 107 disposed on the insulating layer 106. The pre-polishing substructure 109 has a first surface 109a and a second surface 109b. The first surface 109a corresponds to the first surface 100a of the semiconductor wafer 100 and the first surface 101a of the pre-substructure wafer 101. The second surface 109b corresponds to the second surface 100b of the semiconductor wafer 100 and the second surface 101b of the pre-substructure wafer 101.

A plurality of pre-polishing substructures 109 that respectively correspond to the plurality of layer portions 10 of the layered chip package 1 are each fabricated through the steps described with reference to FIG. 6 to FIG. 8.

Figure 9:
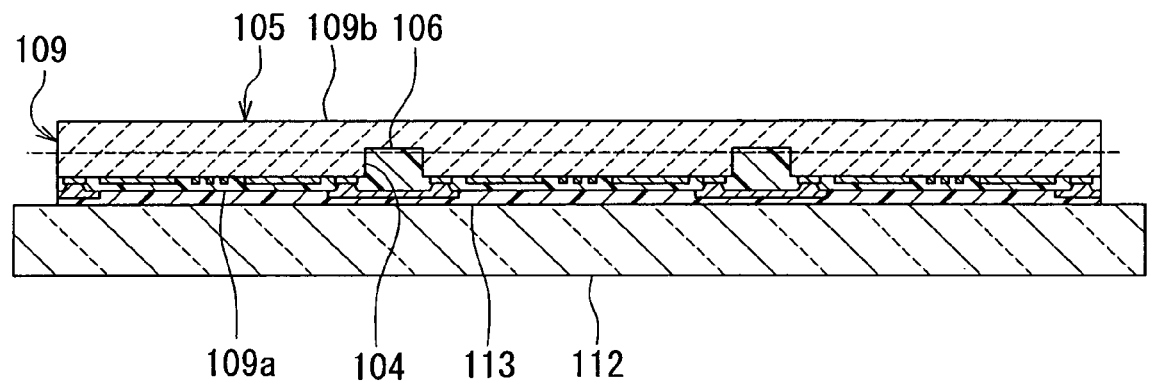
FIG. 9 is a cross-sectional view of a portion of a structure fabricated in a step that follows the step of FIG. 8.

FIG. 9 shows a step that follows the step of FIG. 8. In this step, a pre-polishing substructure 109 is bonded to a plate-shaped jig 112 shown in FIG. 9 with an insulating adhesive such that the first surface 109a of the pre-polishing substructure 109 faces a surface of the jig 112. The pre-polishing substructure 109 bonded to the jig 112 will be hereinafter called a first pre-polishing substructure 109. The pre-substructure wafer 101 serving as a basis for fabricating the first pre-polishing substructure 109 will be hereinafter called a first pre-substructure wafer 101. An insulating layer 113 formed by the adhesive covers the electrodes 32 and will become part of the insulating portion 31. It is preferred that the insulating layer 113 be transparent.

Next, the second surface 109b of the first pre-polishing substructure 109 is polished. This polishing is performed until the plurality of grooves 104 become exposed. In FIG. 9 the broken line indicates the position of the surface 109b after the polishing. As a result of polishing the second surface 109b of the first pre-polishing substructure 109, the first pre-polishing substructure 109 is thinned by the polishing and thereby a substructure 110 is formed in the state of being bonded to the jig 112. The substructure 110 has a thickness of, for example, 30 to 100 µm.

Figure 10:
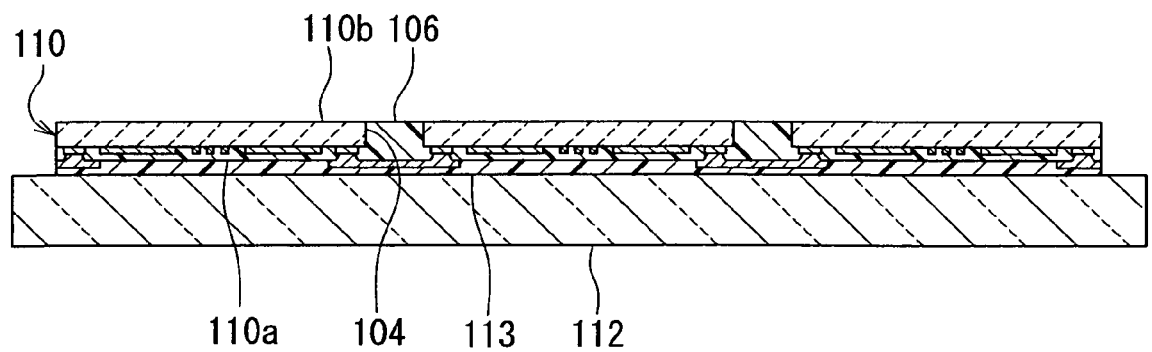
FIG. 10 is a cross-sectional view of a portion of a substructure fabricated in a step that follows the step of FIG. 9.

FIG. 10 shows the substructure 110 bonded to the jig 112. The substructure 110 bonded to the jig 112 will be hereinafter called a first substructure 110. The first substructure 110 has a first surface 110a corresponding to the first surface 109a of the first pre-polishing substructure 109, and a second surface 110b opposite to the first surface 110a. The second surface 110b is the polished surface.

Figure 18:
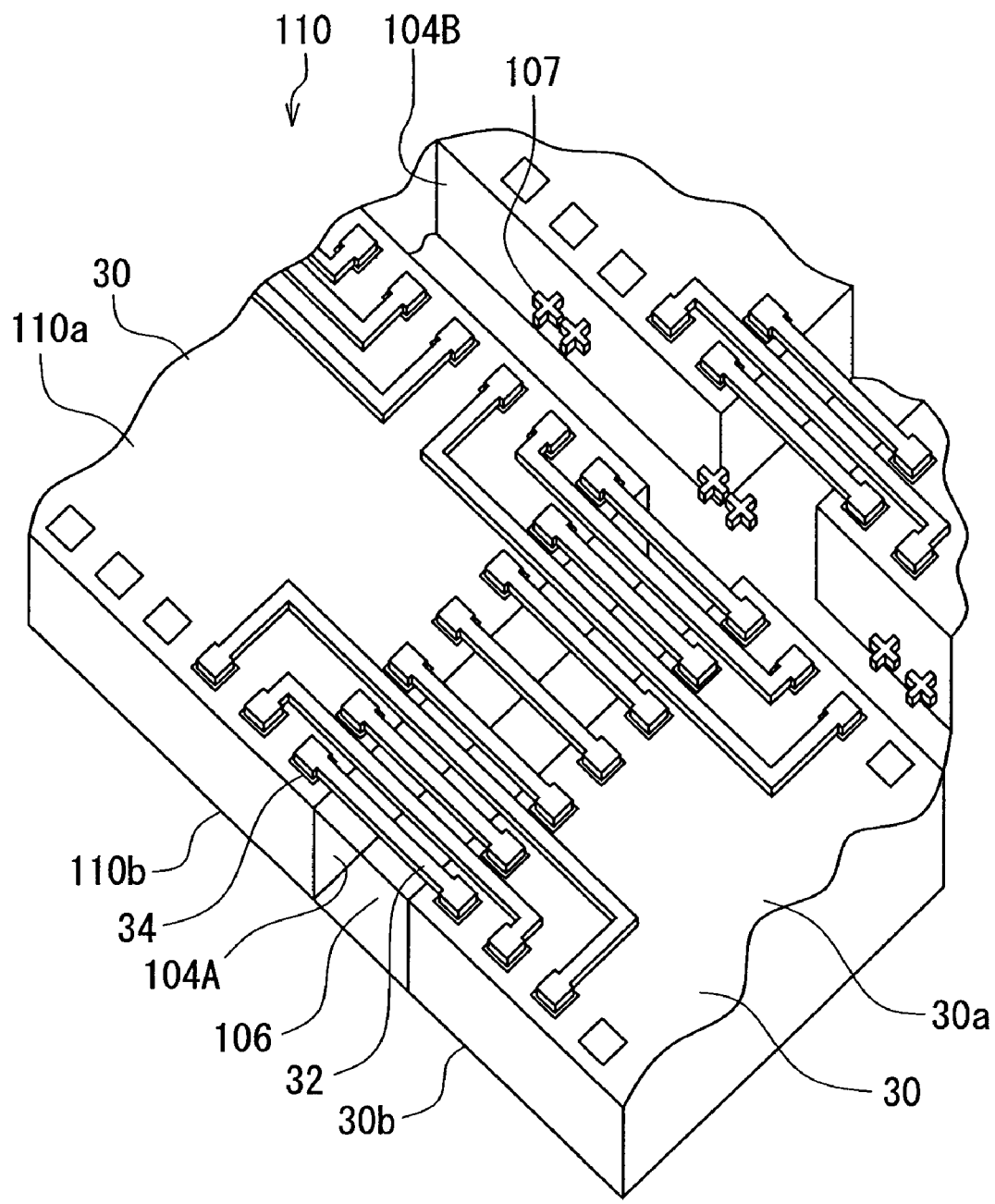
FIG. 18 is a perspective view of a portion of the substructure fabricated in the step of FIG. 10.

FIG. 18 shows a portion of the first substructure 110 fabricated in the step of FIG. 10. As previously described, by polishing the second surface 109b of the first pre-polishing substructure 109 until the grooves 104 become exposed, the plurality of pre-semiconductor-chip portions 30P are separated from each other and thereby become the semiconductor chips 30.

Figure 11:
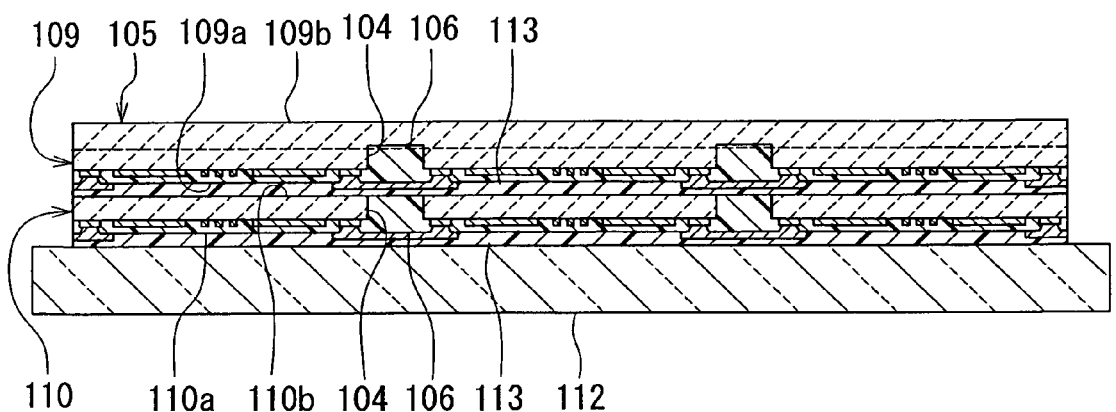
FIG. 11 is a cross-sectional view of a portion of a stack of layers fabricated in a step that follows the step of FIG. 10.

FIG. 11 shows a step that follows the step of FIG. 10. In this step, a pre-polishing substructure 109 is bonded with an insulating adhesive to the first substructure 110 bonded to the jig 112. The pre-polishing substructure 109 is bonded to the first substructure 110 such that the first surface 109a faces the polished surface, that is, the second surface 110b, of the first substructure 110. The pre-polishing substructure 109 to be bonded to the first substructure 110 will be hereinafter called a second pre-polishing substructure 109. The pre-substructure wafer 101 serving as a basis for fabricating the second pre-polishing substructure 109 will be hereinafter called a second pre-substructure wafer 101. An insulating layer 113 formed by the adhesive covers the electrodes 32 and will become part of the insulating portion 31. It is preferred that the insulating layer 113 be transparent.

Next, the second surface 109b of the second pre-polishing substructure 109 is polished. This polishing is performed until the plurality of grooves 104 become exposed. In FIG. 11 the broken line indicates the position of the surface 109b after the polishing. As a result of polishing the second surface 109b of the second pre-polishing substructure 109, the second pre-polishing substructure 109 is thinned by the polishing and thereby a substructure 110 is formed in the state of being stacked on the first substructure 110. This substructure 110 stacked on the first substructure 110 will be hereinafter called a second substructure 110.

Figure 12:
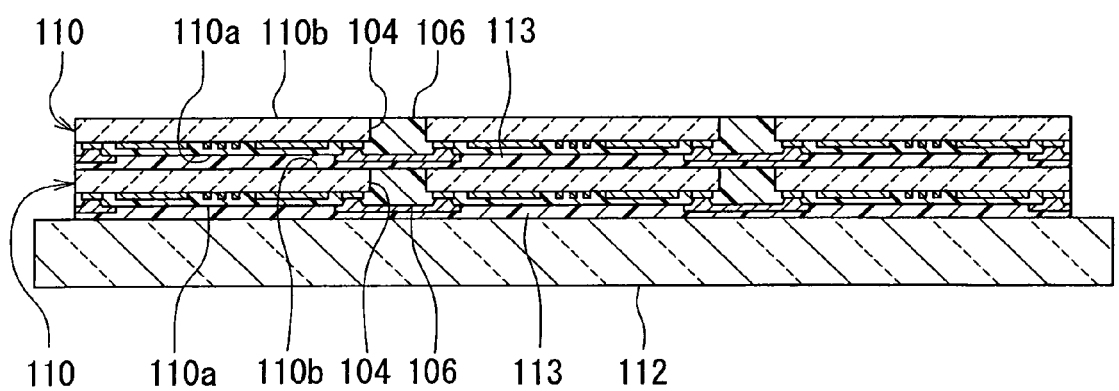
FIG. 12 is a cross-sectional view of a portion of a stack of layers fabricated in a step that follows the step of FIG. 11.

FIG. 12 shows a state in which the second surface 109b of the second pre-polishing substructure 109 has been polished and the first and second substructures 110 have been stacked on the jig 112. The second substructure 110 has a first surface 110a corresponding to the first surface 109a of the second pre-polishing substructure 109, and a second surface 110b opposite to the first surface 110a. The second surface 110b is the polished surface. The second substructure 110 has a thickness of, for example, 30 to 100 µm, as does the first substructure 110.

Here, if the insulating layers 106 and 113 are transparent, using a transparent jig such as an acrylic plate or a glass plate as the jig 112 makes it possible that the alignment marks 107 of the first substructure 110 and the second pre-polishing substructure 109 are visible from the outside of the jig 112 when the second pre-polishing substructure 109 is bonded to the first substructure 110. As a result, it is possible, through the use of the alignment marks 107, to perform alignment of the first substructure 110 and the second pre-polishing substructure 109.

Figure 13:
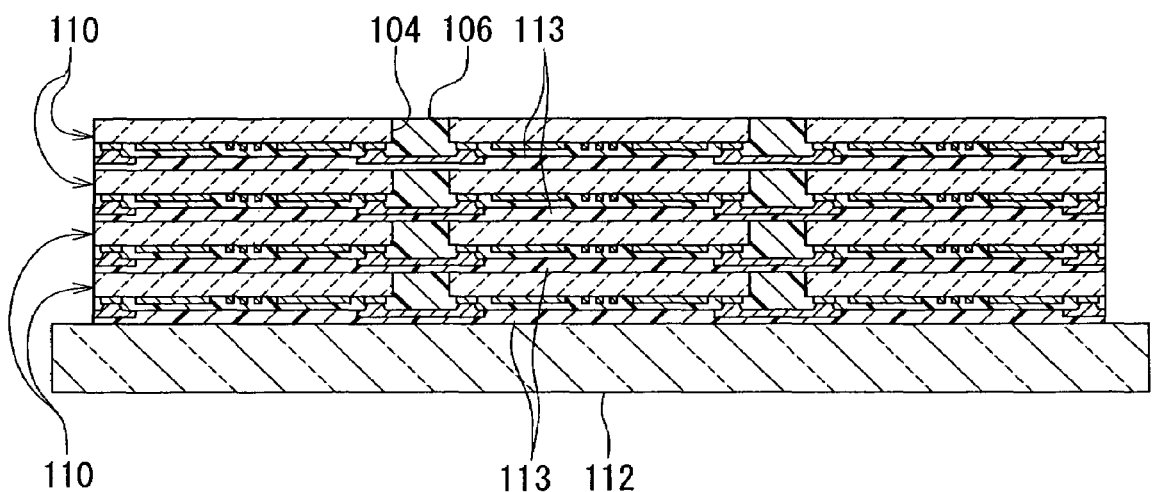
FIG. 13 is a cross-sectional view of a portion of a stack of layers fabricated in a step that follows the step of FIG. 12.

One or more additional substructures 110 may be stacked on the second substructure 110 by repeating the steps shown in FIG. 11 and FIG. 12 so that a total of three or more substructures 110 may be stacked on the jig 112. Here, by way of example, four substructures 110 shall be stacked on the jig 112 as shown in FIG. 13. In the present embodiment, the number of the substructures 110 to be stacked on the jig 112 may be any plural number.

Figure 19:
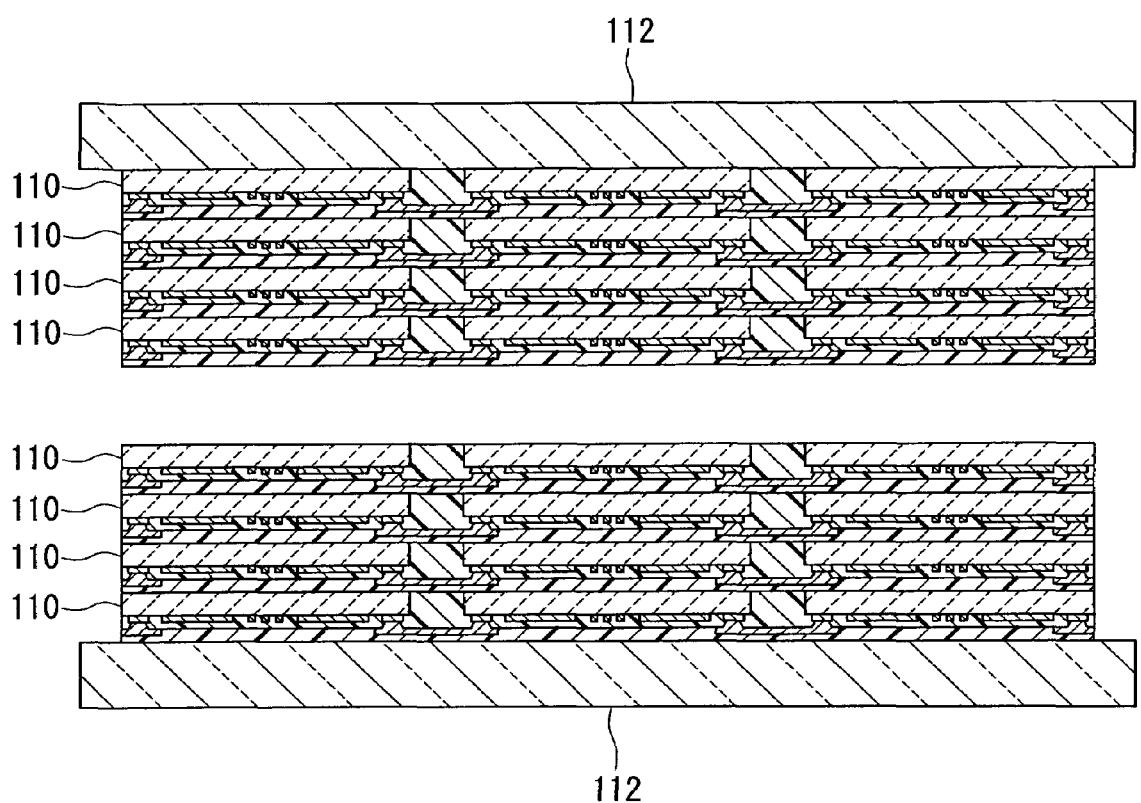
FIG. 19 is an illustrative view showing a step that follows the step of FIG. 13.

FIG. 19 shows a step that follows the step of FIG. 13. In this step, two stacks each of which includes four substructures 110 are prepared and the two stacks are bonded to each other to thereby fabricate a stack including eight substructures 110. The two stacks each including four substructures 110 are each fabricated through the steps shown in FIG. 9 to FIG. 13. The combination of the jig 112 and the stack of four substructures 110 shown on the upper side of FIG. 19 is fabricated by separating the jig 112 from the stack shown in FIG. 13 and then bonding the jig 112 to a surface of this stack opposite to the surface to which the jig 112 was initially bonded. In this way, by re-bonding the jig 112 for one of the two stacks to be bonded to each other, it is possible to stack eight substructures 110 such that the relative vertical positions of the first surface and the second surface are the same among the eight substructures 110, as shown in FIG. 19.

Figure 20:
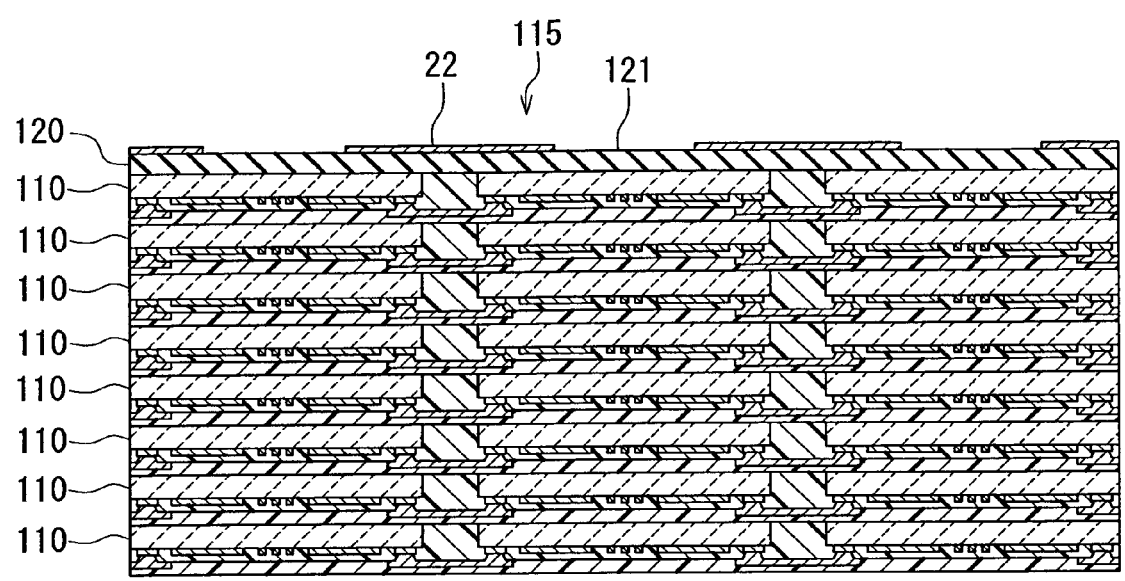
FIG. 20 is a cross-sectional view of a portion of a layered substructure fabricated in a step that follows the step of FIG. 19.
Figure 21:
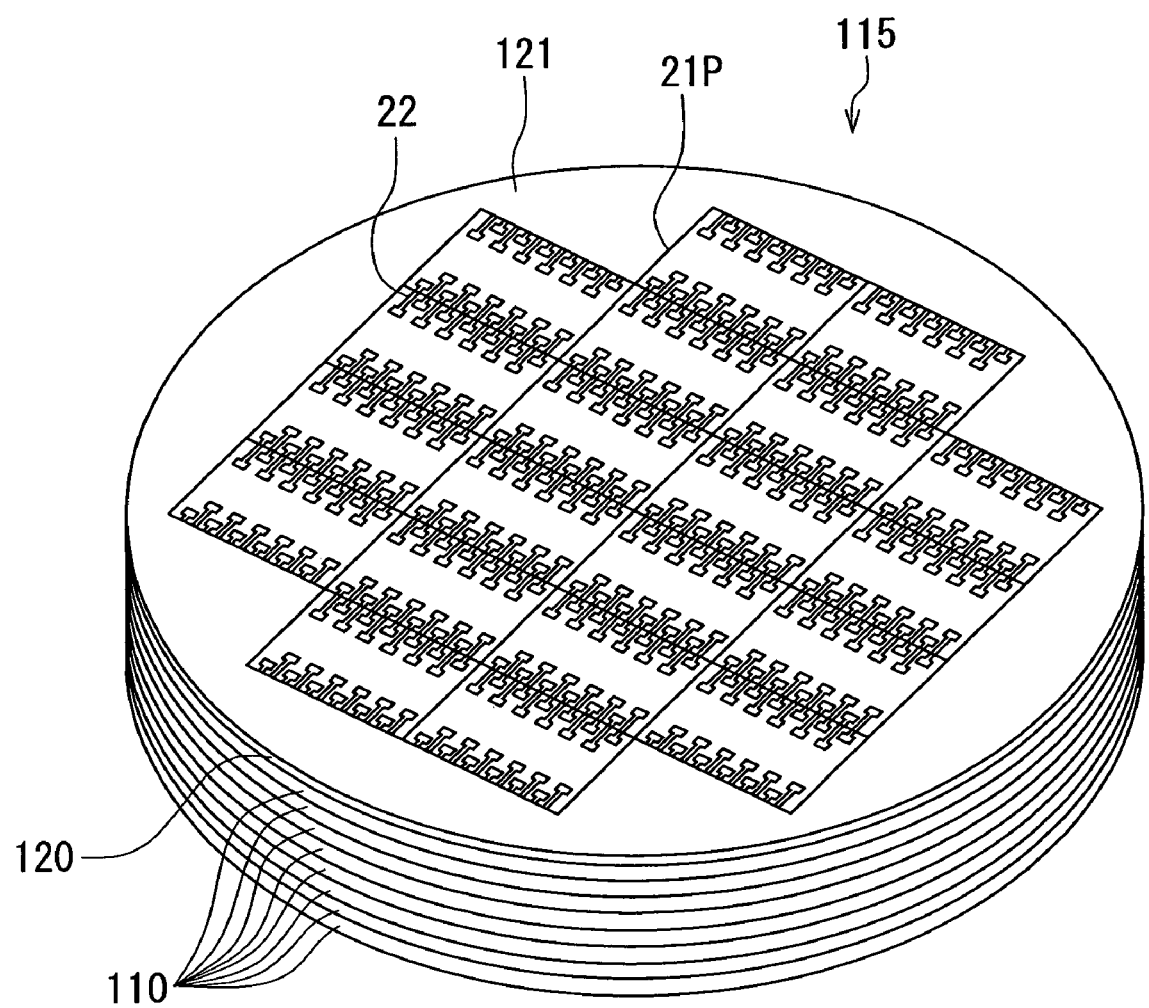
FIG. 21 is a perspective view of the layered substructure fabricated in the step that follows the step of FIG. 19.

FIG. 20 and FIG. 21 show a step that follows the step of FIG. 19. In this step, a layered substructure 115 is fabricated by stacking a terminal wafer 120 on the uppermost one of the eight substructures 110 included in the stack fabricated in the step of FIG. 19. The terminal wafer 120 has a wafer main body 121 that is plate-shaped and formed of an insulating material such as a resin or ceramic. The wafer main body 121 includes a plurality of pre-terminal-layer-body portions 21P that will be separated from each other later to thereby become the terminal layer main bodies 21. The terminal wafer 120 further includes a plurality of groups of pad-shaped terminals 22 disposed on the top surface of the wafer main body 121. One each group of pad-shaped terminals 22 is disposed in each pre-terminal-layer-body portion 21P. FIG. 20 and FIG. 21 show an example in which, at the boundaries between every two adjacent pre-terminal-layer-body portions 21P, pad-shaped terminals 22 disposed in one of the two adjacent pre-terminal-layer-body portions 21P are coupled to those disposed in the other of the two adjacent pre-terminal-layer-body portions 21P. However, it is not necessarily required that pad-shaped terminals 22 disposed in one of two adjacent pre-terminal-layer-body portions 21P be coupled to those disposed in the other of the two adjacent pre-terminal-layer-body portions 21P. The wafer main body 121 may be transparent. In this case, alignment marks may be provided on the top surface of the wafer main body 121 at the positions of the boundaries between every two adjacent pre-terminal-layer-body portions 21P.

In the present embodiment, the step of fabricating the layered substructure 115 includes: the step of fabricating the first pre-substructure wafer 101; the step of fabricating the second pre-substructure wafer 101; the step of fabricating the first pre-polishing substructure 109 by using the first pre-substructure wafer 101; the step of fabricating the second pre-polishing substructure 109 by using the second pre-substructure wafer 101; the step of bonding the first pre-polishing substructure 109 to the jig 112; the first polishing step of polishing the second surface 109b of the first pre-polishing substructure 109 so as to form the first substructure 110; the step of bonding the second pre-polishing substructure 109 to the first substructure 110; and the second polishing step of polishing the second surface 109b of the second pre-polishing substructure 109 so as to form the second substructure 110.

Each of the first and second pre-substructure wafers 101 is fabricated through the step described with reference to FIG. 5. Each of the first and second pre-polishing substructures 109 is fabricated through the steps described with reference to FIG. 6 to FIG. 8. In the step of bonding the first pre-polishing substructure 109 to the jig 112, as shown in FIG. 9, the first pre-polishing substructure 109 is bonded to the jig 112 such that the first surface 109a of the first pre-polishing substructure 109 faces the jig 112. In the first polishing step, as shown in FIG. 9 and FIG. 10, the second surface 109b of the first pre-polishing substructure 109 is polished so that the first pre-polishing substructure 109 is thinned by the polishing and thereby the first substructure 110 is formed in the state of being bonded to the jig 112. In the step of bonding the second pre-polishing substructure 109 to the first substructure 110, as shown in FIG. 11, the second pre-polishing substructure 109 is bonded to the first substructure 110 such that the first surface 109a of the second pre-polishing substructure 109 faces the polished surface, that is, the second surface 110b, of the first substructure 110. In the second polishing step, the second surface 109b of the second pre-polishing substructure 109 is polished so that the second pre-polishing substructure 109 is thinned by the polishing and thereby the second substructure 110 is formed in the state of being stacked on the first substructure 110.

If each pre-polishing substructure 109 is polished alone into the substructure 110, the substructure 110 becomes difficult to handle and also becomes susceptible to damage as the substructure 110 is made thin to a thickness of, for example, 30 to 100 µm. In addition, because of a difference in thermal expansion coefficient between the semiconductor chip 30 and the insulating layer 106 in the substructure 110, the substructure 110 will become curved as it becomes thin. This also makes it difficult to handle the substructure 110 and makes the substructure 110 susceptible to damage.

According to the present embodiment, the first pre-polishing substructure 109 is polished in the state of being bonded to the jig 112. This facilitates handling of the first substructure 110 formed by thinning the first pre-polishing substructure 109 by the polishing, and makes the first substructure 110 resistant to damage. In addition, the second pre-polishing substructure 109 is polished in the state of being bonded to the first substructure 110 bonded to the jig 112. This facilitates handling of the second substructure 110 formed by thinning the second pre-polishing substructure 109 by the polishing, and makes the second substructure 110 resistant to damage. The same holds true for one or more additional substructures 110 to be stacked on the second substructure 110.

In the present embodiment, the method of fabricating the layered substructure 115 is not limited to the method described with reference to FIG. 5 to FIG. 21. For example, the layered substructure 115 can be fabricated through: bonding two pre-polishing substructures 109 to each other such that the respective first surfaces 109a face toward each other; polishing the respective second surfaces 109b of the two pre-polishing substructures 109 and thereby forming a stack including two substructures 110; and stacking a plurality of such stacks. Alternatively, the layered substructure 115 can be fabricated through: bonding two substructures 110 to each other such that the respective second surfaces 110b face toward each other and thereby forming a stack of the two substructures 110; and stacking a plurality of such stacks.

Figure 22:
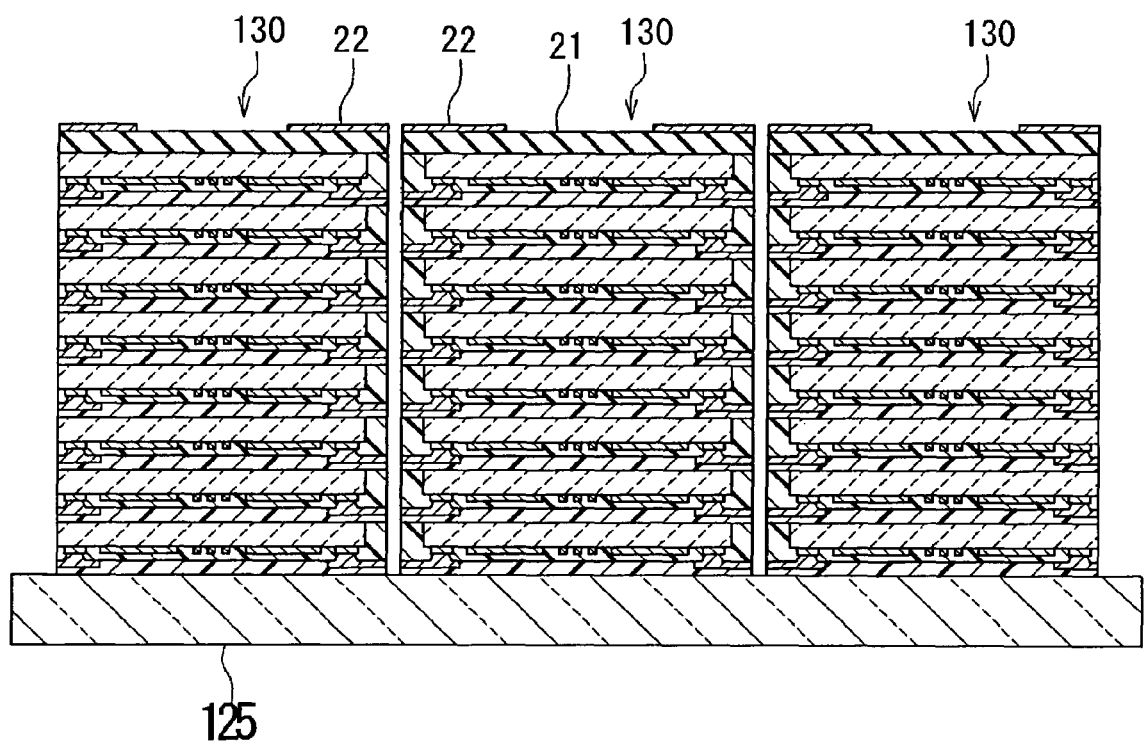
FIG. 22 is a cross-sectional view of a portion of a main body aggregate fabricated in a step that follows the step of FIG. 20.
Figure 23:
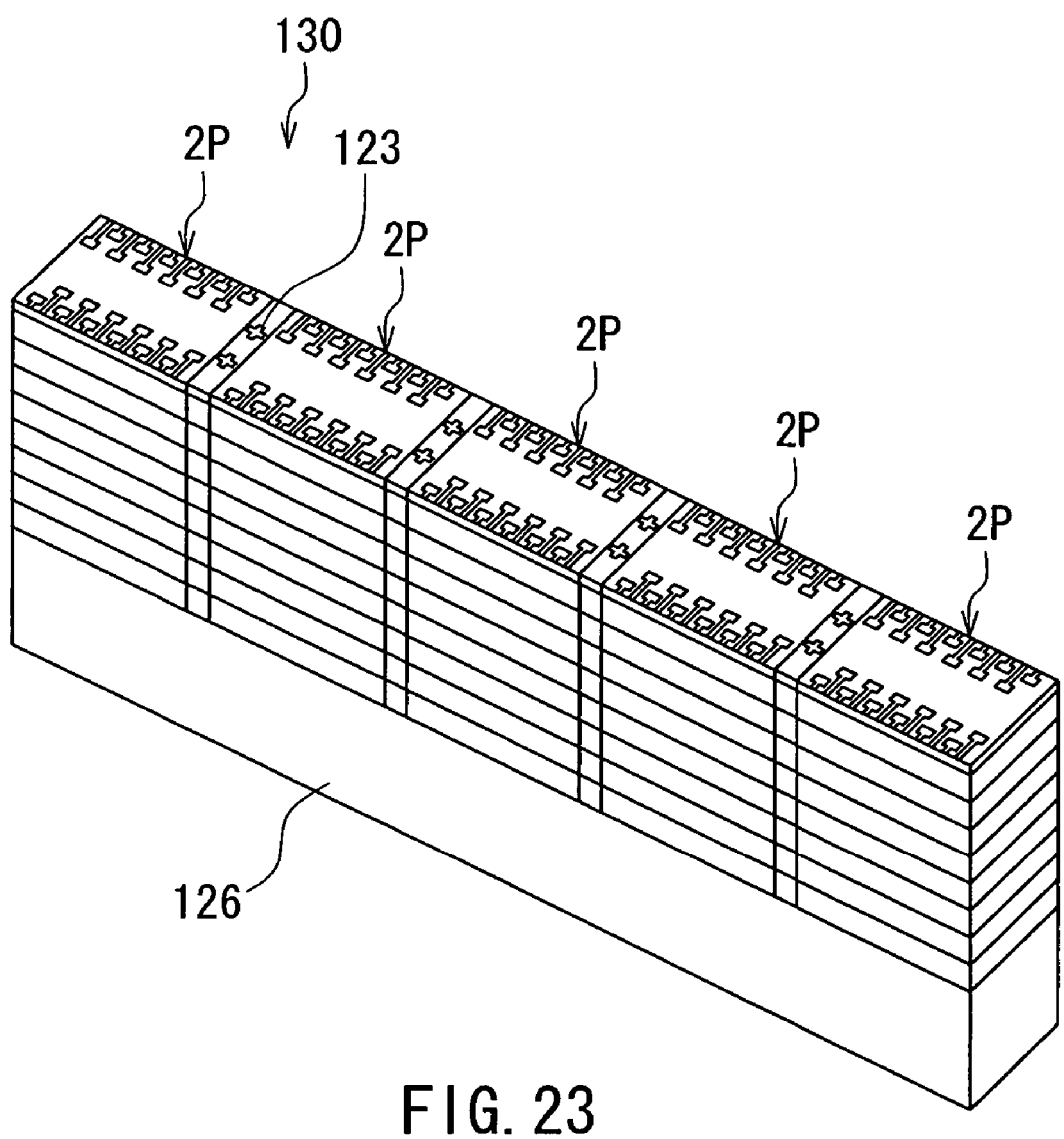
FIG. 23 is a perspective view of an example of the main body aggregate fabricated in the step of FIG. 22.
Figure 24:
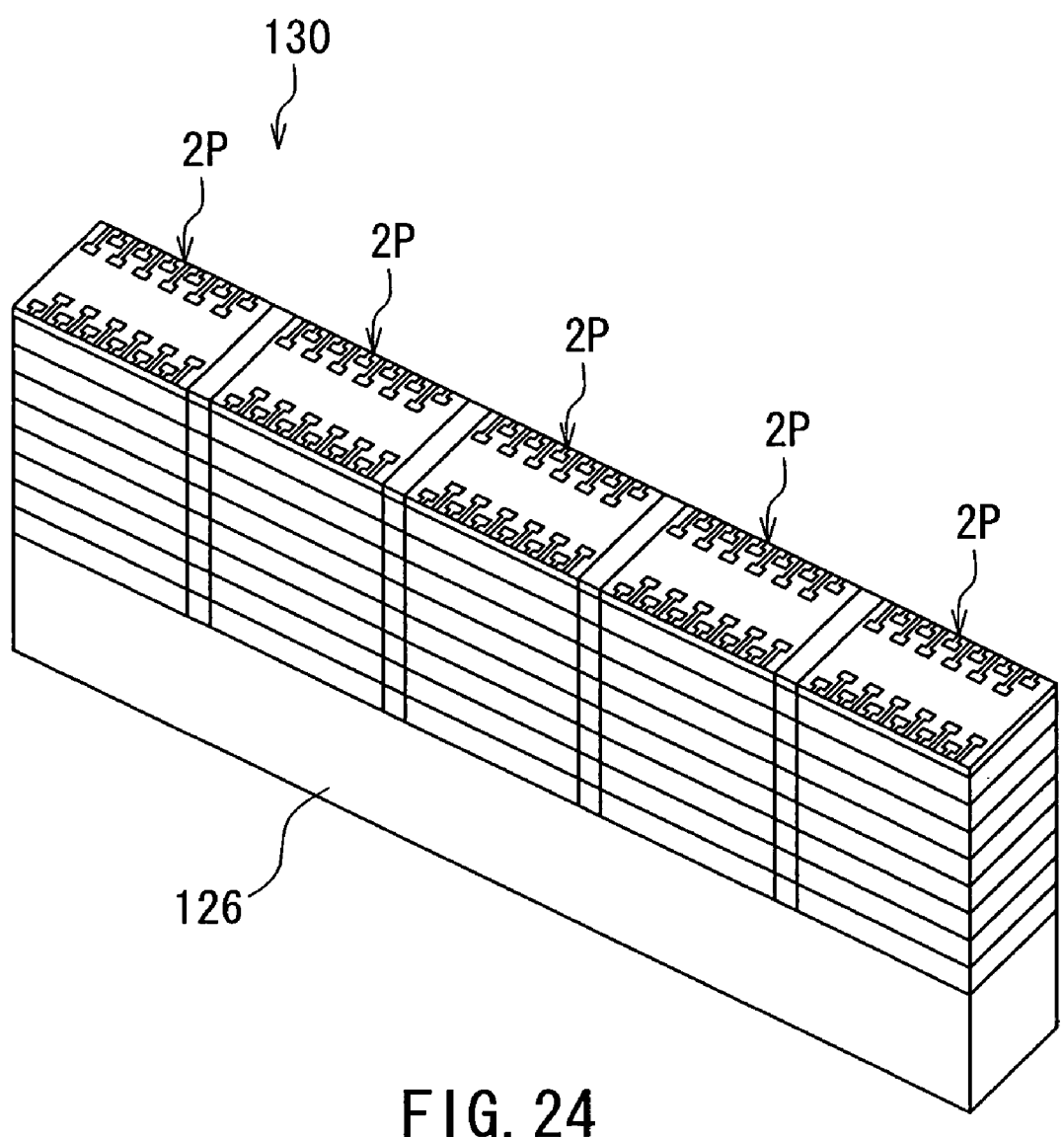
FIG. 24 is a perspective view of another example of the main body aggregate fabricated in the step of FIG. 22.

A description will now be made on the step of fabricating a plurality of layered chip packages 1 by using the layered substructure 115. In this step, first, as shown in FIG. 22, the layered substructure 115 is cut with a dicing saw along the first grooves 104A of FIG. 18 to provide a plurality of main body aggregates 130. FIG. 23 shows an example of each main body aggregate 130. FIG. 24 shows another example of each main body aggregate 130. As shown in FIG. 23 and FIG. 24, each main body aggregate 130 includes a plurality of pre-main-body portions 2P that are aligned in one direction that is orthogonal to the stacking direction of the plurality of layer portions 10 of the layered chip package 1. Each of the pre-main-body portions 2P will become the main body 2 later. The main body aggregate 130 shown in FIG. 23 is obtained by cutting the layered substructure 115 in which the wafer main body 121 of the terminal wafer 120 is transparent and alignment marks 123 are provided on the top surface of the wafer main body 121 at the positions of the boundaries between every adjacent two of the pre-terminal-layer-body portions 21P. The main body aggregate 130 shown in FIG. 24 is obtained by cutting the layered substructure 115 in which the alignment marks 123 are not provided on the top surface of the wafer main body 121. While FIG. 23 and FIG. 24 show that the main body aggregate 130 includes five pre-main-body portions 2P, the main body aggregate 130 can include any plural number of pre-main-body portions 2P.

The layered substructure 115 may be cut in the state of being bonded to a plate-shaped jig or to a wafer sheet that is typically used for dicing a wafer. FIG. 22 shows the example in which the layered substructure 115 has been cut in the state of being bonded to a plate-shaped jig 125. While FIG. 22 shows that the jig 125 is not cut, the jig 125 may be cut together with the layered substructure 115.

As shown in FIG. 23 and FIG. 24, the main body aggregate 130 has a top surface, a bottom surface and four side surfaces. A jig 126 may be bonded to the bottom surface of the main body aggregate 130. The jig 126 may be one obtained by cutting the jig 125 bonded to the layered substructure 115 when cutting the layered substructure 115.

Figure 25:
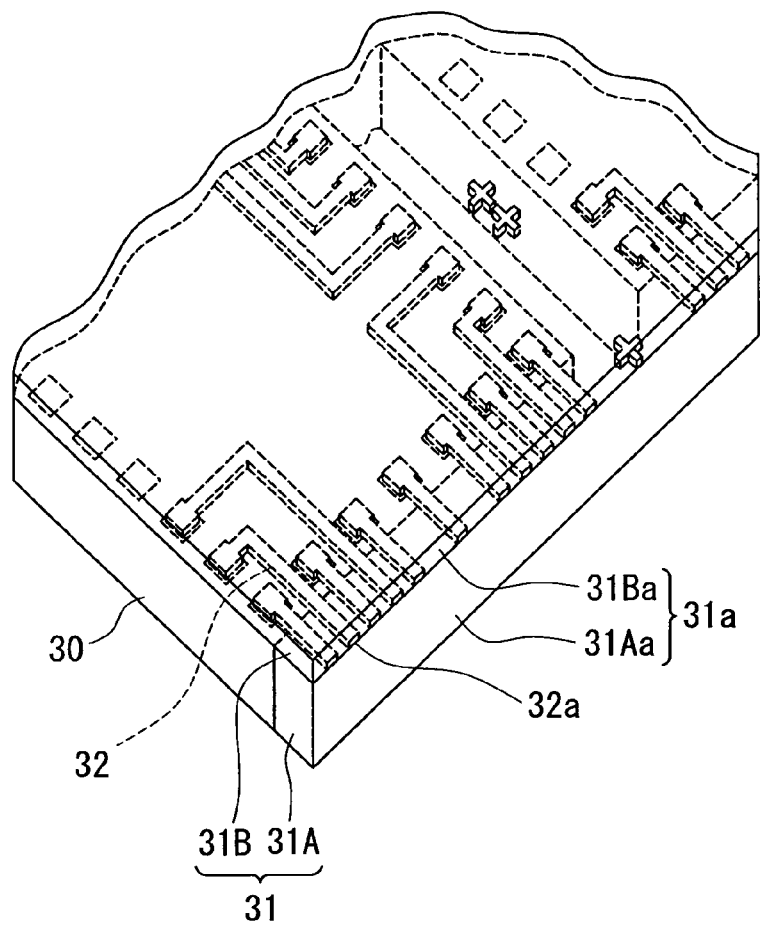
FIG. 25 is a perspective view of a portion of the main body aggregate fabricated in the step of FIG. 22.

In the step of cutting the layered substructure 115, the insulating layer 106 is cut such that a cut surface is formed along the direction in which the first groove 104A of FIG. 18 extends. FIG. 25 shows part of the main body aggregate 130 formed by cutting the layered substructure 115. As shown in FIG. 25, the insulating layer 106 becomes an insulating layer 31A by being cut. The insulating layer 31A is part of the insulating portion 31. In addition, part of the end face 31a of the insulating portion 31 is formed by the cut surface of the insulating layer 106, that is, a cut surface 31Aa of the insulating layer 31A.

In the step of cutting the layered substructure 115, the insulating layer 113 covering the electrodes 32 is also cut when the insulating layer 106 is cut. By being cut, the insulating layer 113 becomes an insulating layer 31B that is another part of the insulating portion 31. In addition, another part of the end face 31a of the insulating portion 31 is formed by the cut surface of the insulating layer 113, that is, a cut surface 31Ba of the insulating layer 31B.

In the step of cutting the layered substructure 115, by cutting the insulating layer 106, the end faces 32a of the plurality of electrodes 32 are exposed from the end face 31a of the insulating portion 31. The end faces 32a are surrounded by the insulating portion 31.

By cutting the layered substructure 115, the end faces 32a of the plurality of electrodes 32 appear at two of the four side surfaces of the main body aggregate 130, the two of the four side surfaces each being parallel to the direction in which the plurality of pre-main-body portions 2P are aligned. To be more specific, the end faces 32Aa of the plurality of electrodes 32A of all the layer portions 10 included in the main body aggregate 130 appear at one of the above two side surfaces of the main body aggregate 130, while the end faces 32Ba of the plurality of electrodes 32B of all the layer portions 10 included in the main body aggregate 130 appear at the other of the two side surfaces of the main body aggregate 130 that is opposite to the one mentioned above.

In the step of fabricating the plurality of layered chip packages 1, after cutting the layered substructure 115, polishing is performed on the two side surfaces of the main body aggregate 130 at which the end faces 32a of the electrodes 32 appear. Next, the wiring 3A, 3B is formed for each of the pre-main-body portions 2P of the main body aggregate 130. In the step of forming the wiring 3A, 3B, a plurality of main body aggregates 130 may be arranged in the stacking direction of the plurality of layer portions 10 and then the wiring 3A, 3B may be formed for the pre-main-body portions 2P of the plurality of main body aggregates 130 at a time. It is thereby possible to form the wiring 3A, 3B for a large number of pre-main-body portions 2P in a short period of time.

Figure 26:
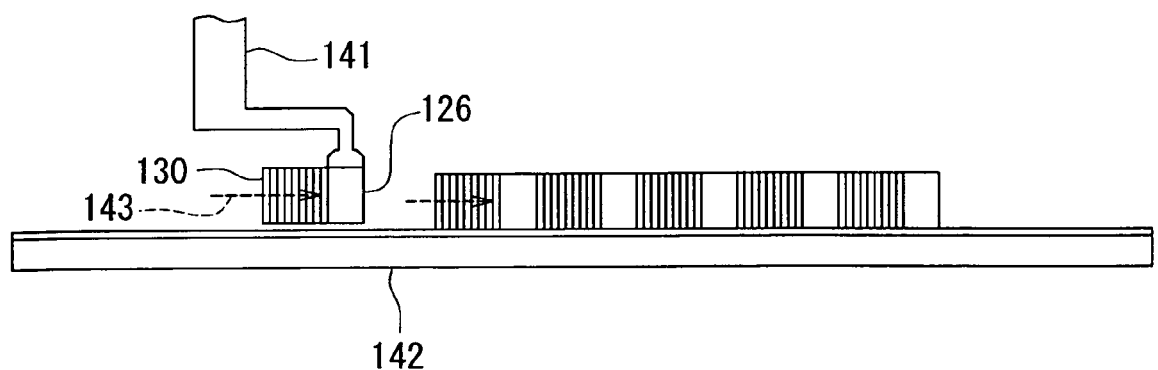
FIG. 26 is an illustrative view showing an example of a method of arranging a plurality of main body aggregates in the manufacturing method for the layered chip package of the first embodiment of the invention.
Figure 27:
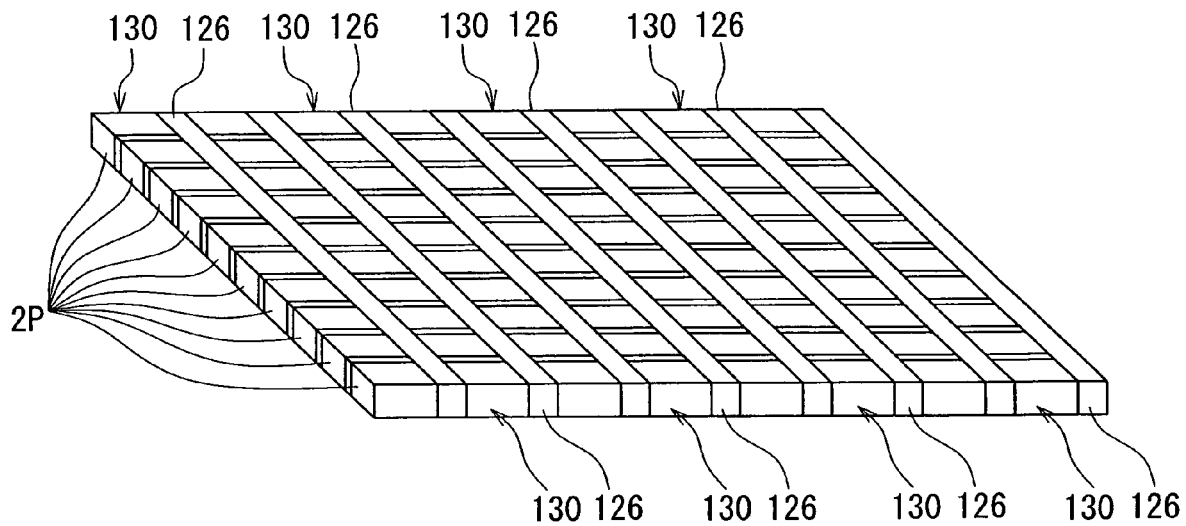
FIG. 27 is a perspective view showing a state in which a plurality of main body aggregates are arranged with a jig bonded to each of the main body aggregates.

FIG. 26 shows an example of a method of arranging a plurality of main body aggregates 130. In this example, a plurality of main body aggregates 130 each of which has the jig 126 bonded thereto are arranged on a table 142, while performing alignment, in the stacking direction of the plurality of layer portions 10 by using a chip bonding apparatus capable of recognizing and controlling the position of a chip. Reference numeral 141 in FIG. 26 indicates a head for holding a chip. In this example, each main body aggregate 130 with the jig 126 bonded thereto is held by the head 141 and placed to a desired position on the table 142 while recognizing and controlling the position of the main body aggregate 130. FIG. 27 shows a state in which a plurality of main body aggregates 130 each of which has the jig 126 bonded thereto are arranged in the stacking direction of the plurality of layer portions 10. The plurality of main body aggregates 130 thus arranged may be fixed by being bonded to each other such that they are easily separable.

When arranging the plurality of main body aggregates 130, the position of the edge of each main body aggregate 130 and/or the positions of the end faces 32a of the electrodes 32 that appear at the side surfaces of each main body aggregate 130 may be recognized with an image recognizer included in the chip bonding apparatus. It is thereby possible to recognize and control the position of each main body aggregate 130.

Figure 28:
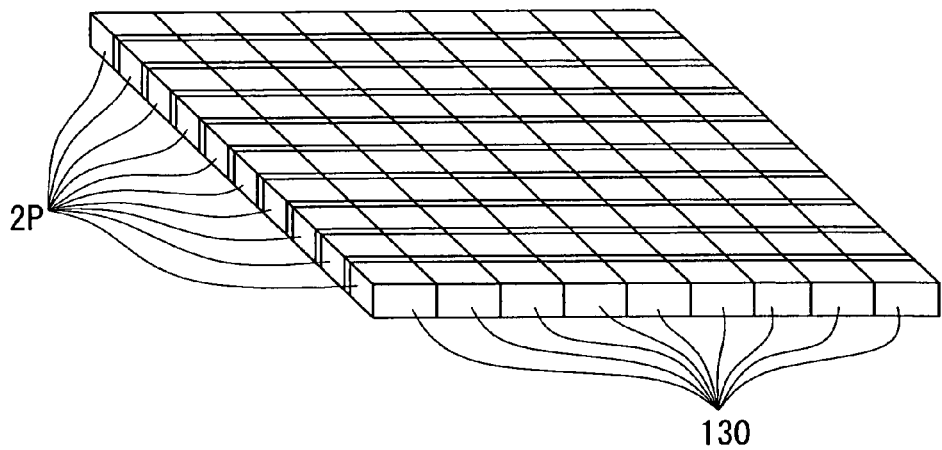
FIG. 28 is a perspective view showing a state in which a plurality of main body aggregates are arranged without any jig bonded to each of the main body aggregates.

Alternatively, a plurality of main body aggregates 130 each without the jig 126 bonded thereto may be arranged in the stacking direction of the plurality of layer portions 10 while performing alignment. FIG. 28 shows the plurality of main body aggregates 130 arranged in such a manner. In this case, too, the plurality of main body aggregates 130 thus arranged may be fixed by being bonded to each other such that they are easily separable.

In the case of arranging a plurality of main body aggregates 130 each without the jig 126 bonded thereto, if the portions to become the insulating portion 31 and the terminal layer main body 21 are transparent and consequently at least either the alignment marks 107 or 123 are observable, the position of each main body aggregate 130 may be recognized and controlled by recognizing at least either the alignment marks 107 or 123 through the use of the image recognizer included in the chip bonding apparatus. In this case, the alignment marks are observed in the direction of the arrow 143 in FIG. 26.

Figure 29:
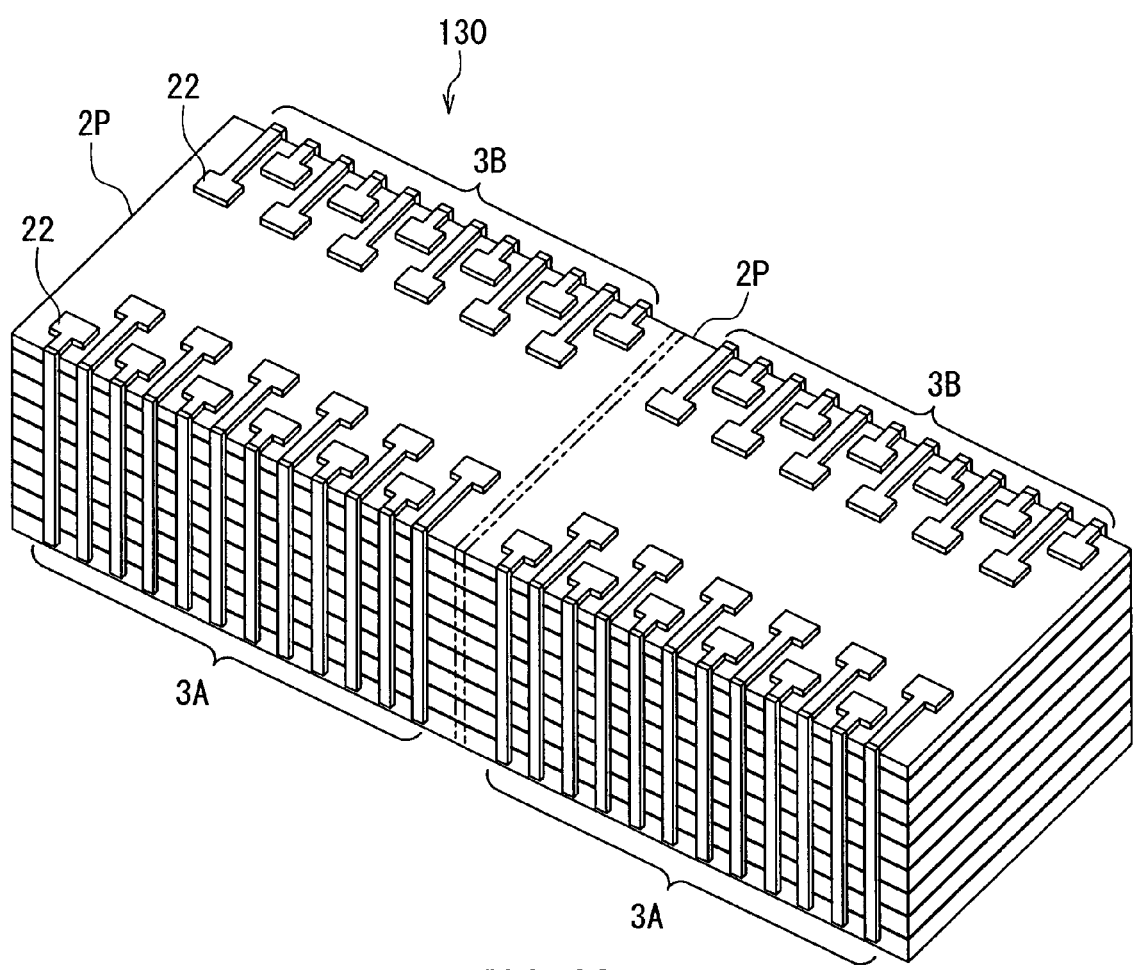
FIG. 29 is a perspective view of a portion of the main body aggregate having undergone the formation of wiring.

Reference is now made to FIG. 29 to describe the step of forming the wiring 3A, 3B. In this step, the wiring 3A, 3B is formed for each of the pre-main-body portions 2P of the main body aggregate 130. The wiring 3A, 3B is formed by frame plating, for example. In this case, first, a seed layer for plating is formed on the side surface of the main body aggregate 130 on which the wiring 3A is to be formed. Next, a frame having grooves is formed on the seed layer. The frame is formed by patterning a photoresist film by photolithography, for example. Next, plating layers to become part of the wiring 3A is formed by plating on the seed layer in the grooves of the frame. Next, the frame is removed and the seed layer except portions thereof located below the plating layers is also removed by etching. As a result, the wiring 3A is formed of the plating layers and the portions of the seed layer remaining therebelow. Next, the wiring 3B is formed in the same way as the wiring 3A on the side surface of the main body aggregate 130 on which the wiring 3B is to be formed. FIG. 29 shows a portion of the main body aggregate 130 having undergone the formation of the wiring 3A, 3B.

Figure 30:
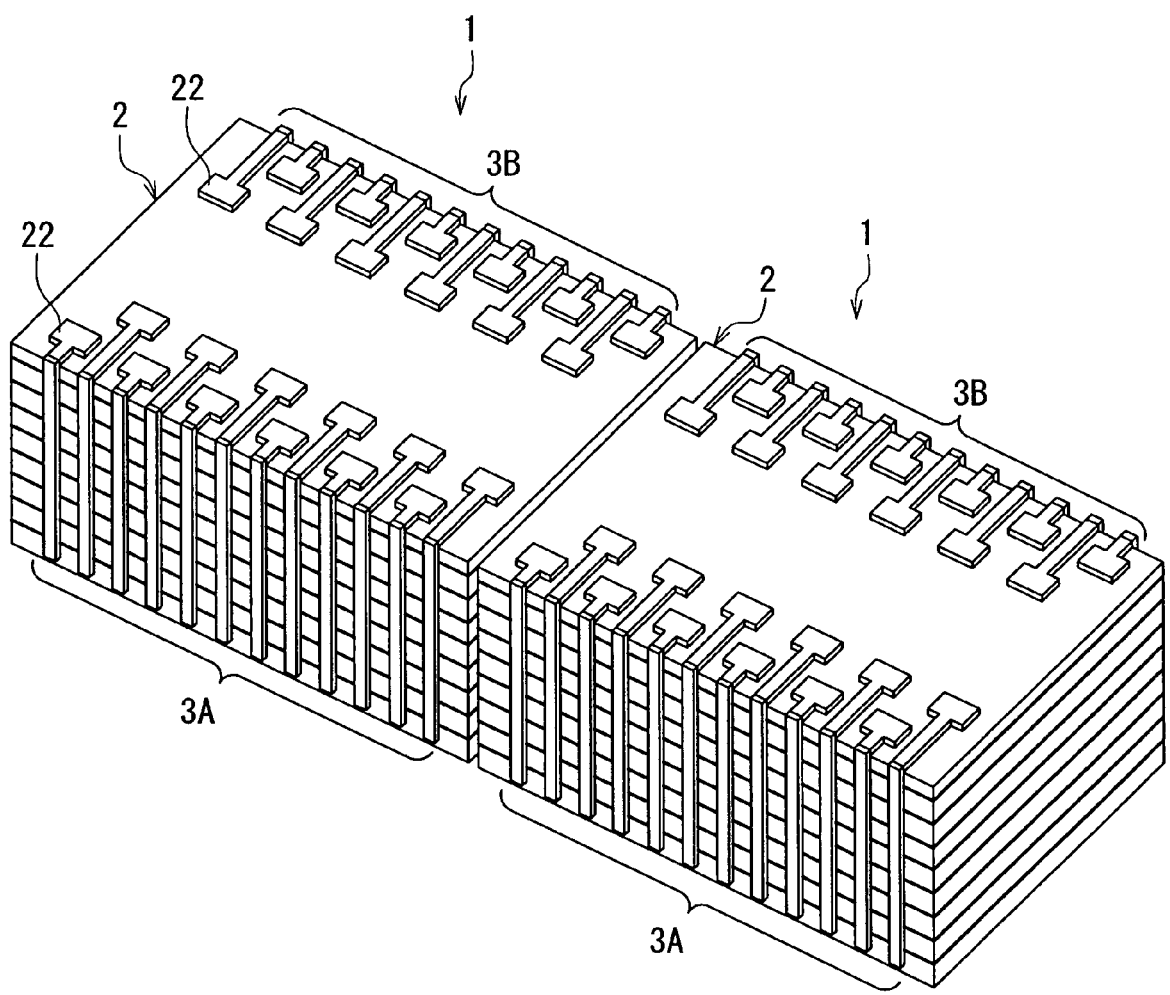
FIG. 30 is a perspective view showing a plurality of layered chip packages formed by cutting the main body aggregate.

Reference is now made to FIG. 30 to describe the step of cutting the main body aggregate 130. In this step, the main body aggregate 130 is cut to separate the plurality of pre-main-body portions 2P included in the main body aggregate 130 from each other so that each of the pre-main-body portions 2P becomes the main body 2 and a plurality of layered chip packages 1 are thereby formed. In this way, as shown in FIG. 30, a plurality of layered chip packages 1 are manufactured at a time.

The layered chip package 1 of the present embodiment can be used as it is as a single electronic component (memory device). For example, the layered chip package 1 can be mounted on a wiring board by a flip-chip technique by placing the layered chip package 1 on the wiring board such that the plurality of pad-shaped terminals 22 face downward.

For example, if a device for use with the layered chip package 1 has a recessed portion to accommodate the layered chip package 1, the layered chip package 1 can be inserted to the recessed portion such that the plurality of pad-shaped terminals 22 face upward. It is thereby possible to connect the pad-shaped terminals 22 to circuits in the device.

Figure 31:
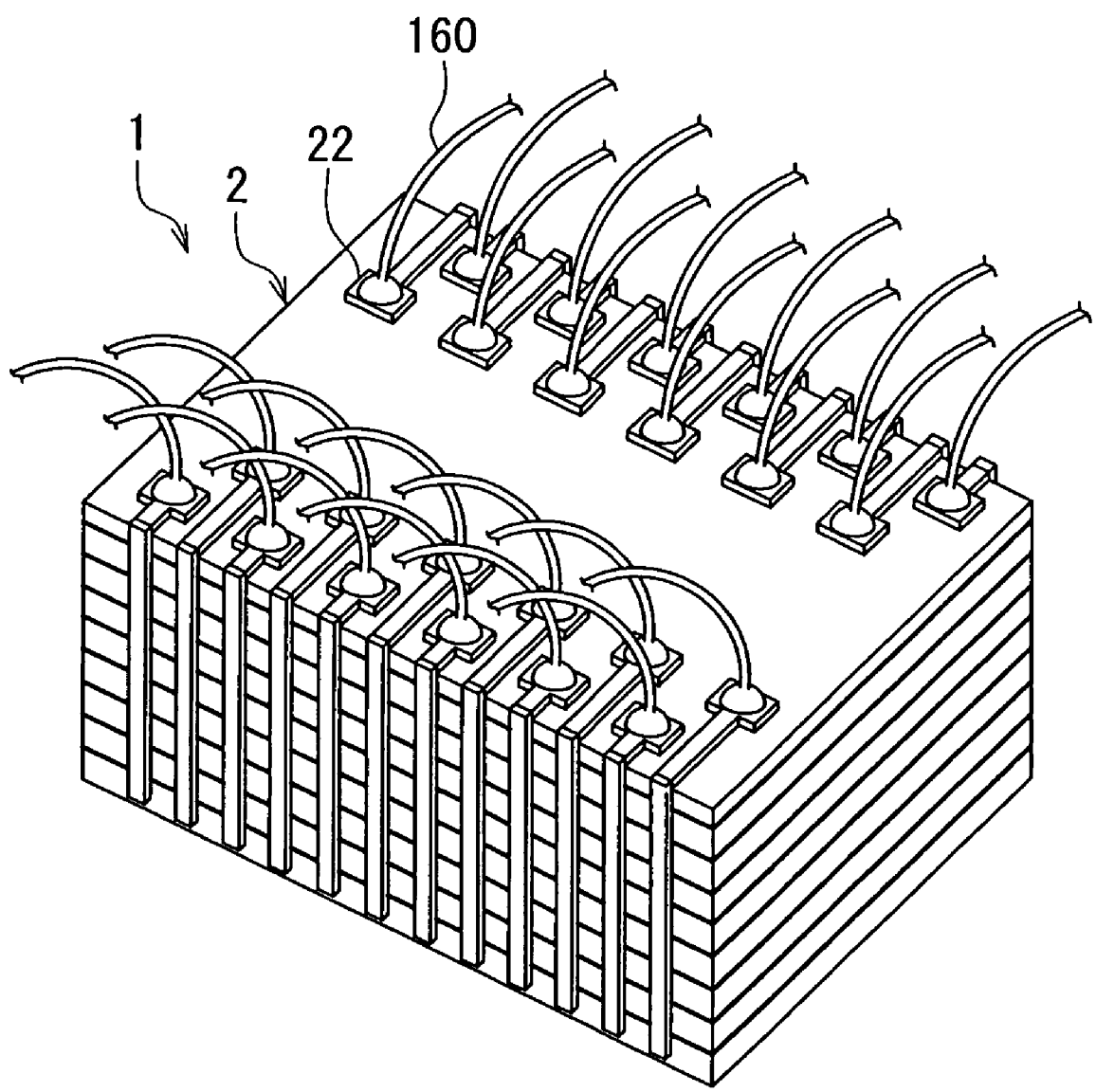
FIG. 31 is a perspective view showing an example of use of the layered chip package of the first embodiment of the invention.

FIG. 31 shows an example of use of the layered chip package 1. In this example, bonding wires 160 are connected at one end to the plurality of pad-shaped terminals 22 of the layered chip package 1. The other end of each of the bonding wires 160 is connected to a terminal of a device for use with the layered chip package 1.

Figure 32:
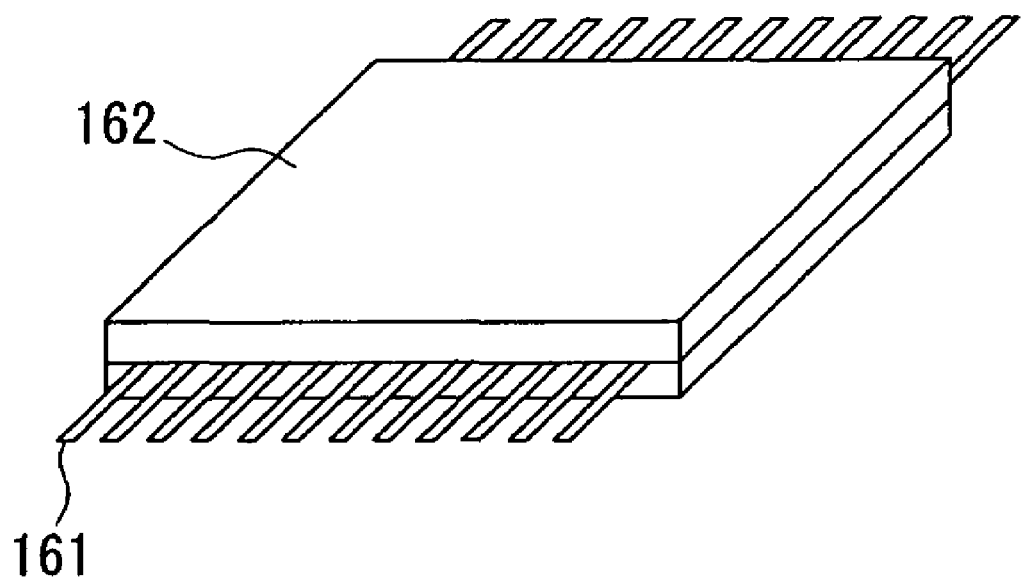
FIG. 32 is a perspective view showing another example of use of the layered chip package of the first embodiment of the invention.
Figure 33:
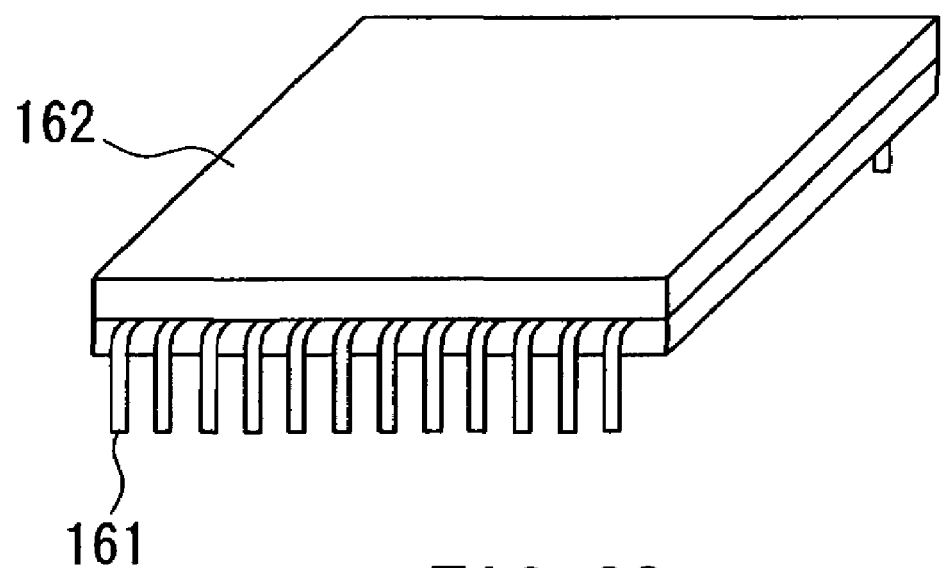
FIG. 33 is a perspective view showing still another example of use of the layered chip package of the first embodiment of the invention.

FIG. 32 and FIG. 33 show other examples of use of the layered chip package 1. In each of these examples, the layered chip package 1 is mounted to a lead frame having a plurality of pins 161 and is sealed with a molded resin. The plurality of pad-shaped terminals 22 of the layered chip package 1 are connected to the plurality of pins 161. The molded resin forms a protection layer 162 for protecting the layered chip package 1. FIG. 32 shows an example in which the plurality of pins 161 extend horizontally. FIG. 33 shows an example in which the plurality of pins 161 are folded downward.

As described so far, according to the present embodiment, it is possible to provide a layered chip package 1 that implements a memory device, the layered chip package 1 including a plurality of chips 30 stacked and being capable of achieving higher integration. The layered chip package 1 of the present embodiment includes a main body 2 having a top surface, a bottom surface and four side surfaces, and wiring 3 disposed on at least one of the side surfaces of the main body 2. The main body 2 includes a plurality of layer portions 10 stacked. Each of the plurality of layer portions 10 includes: a semiconductor chip 30 having a top surface, a bottom surface and four side surfaces; an insulating portion 31 covering at least one of the four side surfaces of the semiconductor chip 30; and a plurality of electrodes 32 connected to the semiconductor chip 30. The insulating portion 31 has at least one end face 31a located at the at least one of the side surfaces of the main body 2 on which the wiring 3 is disposed. Each of the plurality of electrodes 32 has an end face 32a that is surrounded by the insulating portion 31 and located at the at least one of the side surfaces of the main body 2 on which the wiring 3 is disposed. The wiring 3 is connected to the end faces 32a of the plurality of electrodes 32 of the plurality of layer portions 10.

According to the present embodiment, the plurality of semiconductor chips 30 stacked are electrically connected through the wiring 3 disposed on at least one of the side surfaces of the main body 2. Consequently, the present embodiment is free from the problems of the wire bonding method, that is, the problem that it is difficult to reduce the distance between electrodes so as to avoid contact between wires, and the problem that high resistances of the wires hamper a high-speed operation of a circuit.

Compared with the through electrode method, the present embodiment has the following advantages. First, the present embodiment does not require formation of through electrodes in each chip and consequently does not require a large number of steps for forming through electrodes in each chip.

According to the present embodiment, electrical connection between the plurality of semiconductor chips 30 is established through the wiring 3 disposed on at least one of the side surfaces of the main body 2. Consequently, compared with the case of using through electrodes to establish electrical connection between chips, the present embodiment allows easy formation of wiring for establishing electrical connection between the semiconductor chips 30 and increases the reliability of the wiring.

Furthermore, according to the present embodiment, it is possible to easily change the line width and thickness of the wiring 3. Consequently, it is possible to respond to future demands for finer wiring 3.

The through electrode method requires that the through electrodes of upper and lower chips be connected to each other by means of, for example, soldering at high temperatures. In contrast, according to the present embodiment, it is possible to form the wiring 3 at lower temperatures because the wiring 3 can be formed by plating. According to the present embodiment, it is also possible to perform bonding of the plurality of layer portions 10 at low temperatures. Consequently, it is possible to prevent the chips 30 from suffering damage from heat.

The through electrode method further requires that upper and lower chips be accurately aligned for connecting the through electrodes of the upper and lower chips to each other. In contrast, according to the present embodiment, electrical connection between the semiconductor chips 30 is performed not at an interface between every vertically adjacent two of the layer portions 10 but through the use of the wiring 3 disposed on at least one of the side surfaces of the main body 2. Consequently, the accuracy required for alignment of the plurality of layer portions 10 is lower than that required for alignment of a plurality of chips in the through electrode method.

According to the through electrode method, the through electrodes of upper and lower chips are connected to each other by means of, for example, soldering. Consequently, if the plurality of chips stacked include one or more defective chips, it is difficult to replace the defective chip(s) with non-defective one(s). In contrast, according to the present embodiment, it is easy to replace one or more defective chips, if included in the layered chip package 1, with non-defective one(s). To replace a defective chip with a non-defective one, first, the wiring 3 is removed by means of, for example, polishing. Next, the main body 2 is disassembled to separate at least a layer portion 10 including a defective chip 30 from the other layer portions 10, and the defective chip 30 is taken out. According to the present embodiment, every vertically adjacent two of the layer portions 10 are bonded to each other with an adhesive, so that it is easy to separate them from each other. Next, the main body 2 is reconstructed with a non-defective chip 30 in place of the defective chip 30. Next, polishing is performed on the side surface(s) of the reconstructed main body 2 on which the wiring 3 is to be formed, and then the wiring 3 is formed on the polished side surface(s).

The manufacturing method for the layered chip package of the present embodiment allows a reduction in the number of steps and consequently allows a reduction in cost for the layered chip package, compared with the manufacturing method for a layered chip package disclosed in U.S. Pat. No. 5,953,588.

From the foregoing, the present embodiment makes it possible to mass-produce the layered chip package 1 at low cost in a short period of time.

According to the manufacturing method for the layered chip package of the present embodiment, it is possible to easily reduce the thicknesses of the plurality of substructures 110 to constitute the layered substructure 115 while preventing damage to the substructures 110. This allows a high-yield manufacture of the layered chip package 1 that achieves a reduction in size and a high level of integration.

Second Embodiment

A second embodiment of the present invention will now be described. In the layered chip package 1 of the second embodiment, the four side surfaces $2c$ to $2f$ of the main body 2 include at least one first-type side surface on which the wiring 3 is disposed, and at least one second-type side surface on which the wiring 3 is not disposed. The appearance of the layered chip package 1 of the second embodiment is, for example, as shown in FIG. 1 as in the case of the first embodiment. In this example, of the four side surfaces $2c$ to $2f$ of the main body 2, the side surfaces $2c$ and $2d$ are the first-type side surfaces while the side surfaces $2e$ and $2f$ are the second-type side surfaces.

In the second embodiment, the four side surfaces $30c$ to $30f$ of the first-type or second-type semiconductor chip 30 include at least one first-type side surface that has the insulating portion 31 between itself and the at least one first-type side surface of the main body 2, and at least one second-type side surface that is located at the at least one second-type side surface of the main body 2.

Figure 34:
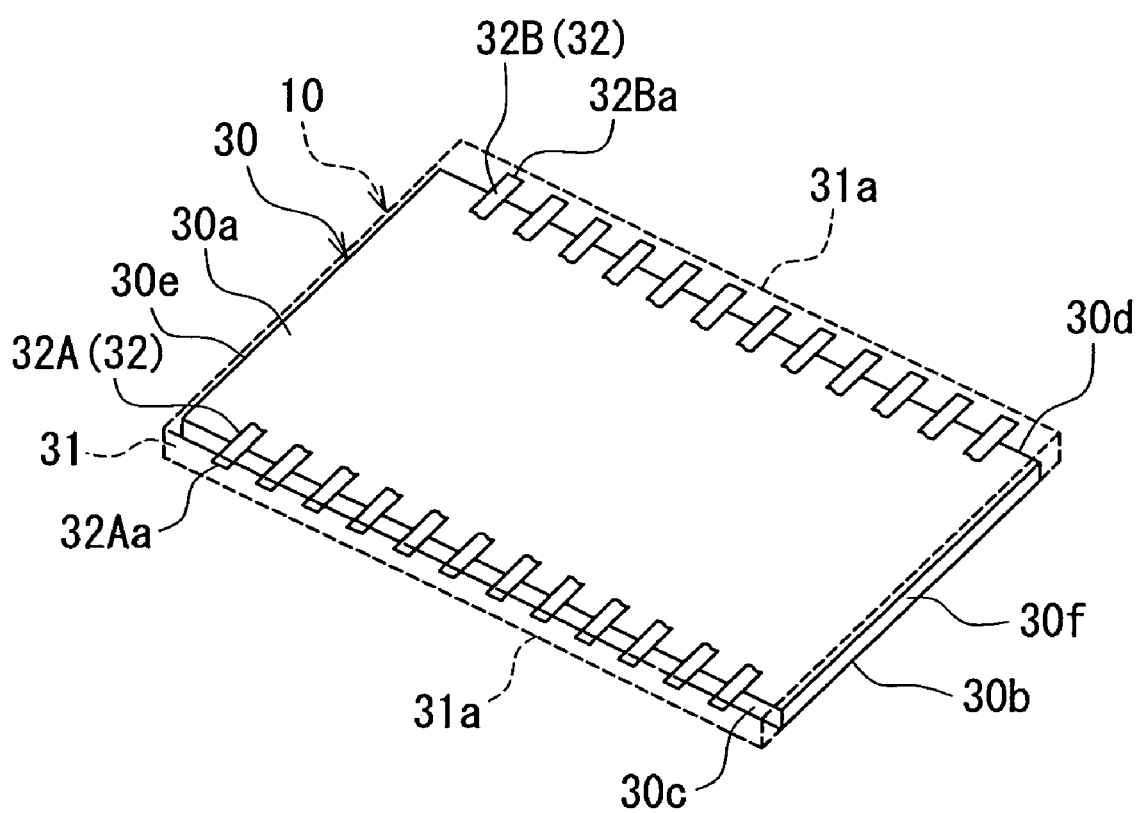
FIG. 34 is a perspective view of one of layer portions included in a layered chip package of a second embodiment of the invention.

FIG. 34 is a perspective view of a layer portion 10 of the second embodiment. According to the second embodiment, the side surfaces $30e$ and $30f$ of the semiconductor chip 30 are respectively located at the side surfaces $2e$ and $2f$ of the main body 2. The side surfaces $30c$ and $30d$ of the semiconductor chip 30 respectively face toward the side surfaces $2c$ and $2d$ of the main body. In the second embodiment, of the four side surfaces of the semiconductor chip 30, the side surfaces $30c$ and $30d$ are covered with the insulating portion 31 while the side surfaces $30e$ and $30f$ are not covered with the insulating portion 31. Thus, of the four side surfaces $30c$ to $30f$ of the semiconductor chip 30, the side surfaces $30c$ and $30d$ are the first-type side surfaces while the side surfaces $30e$ and $30f$ are the second-type side surfaces.

Figure 35:
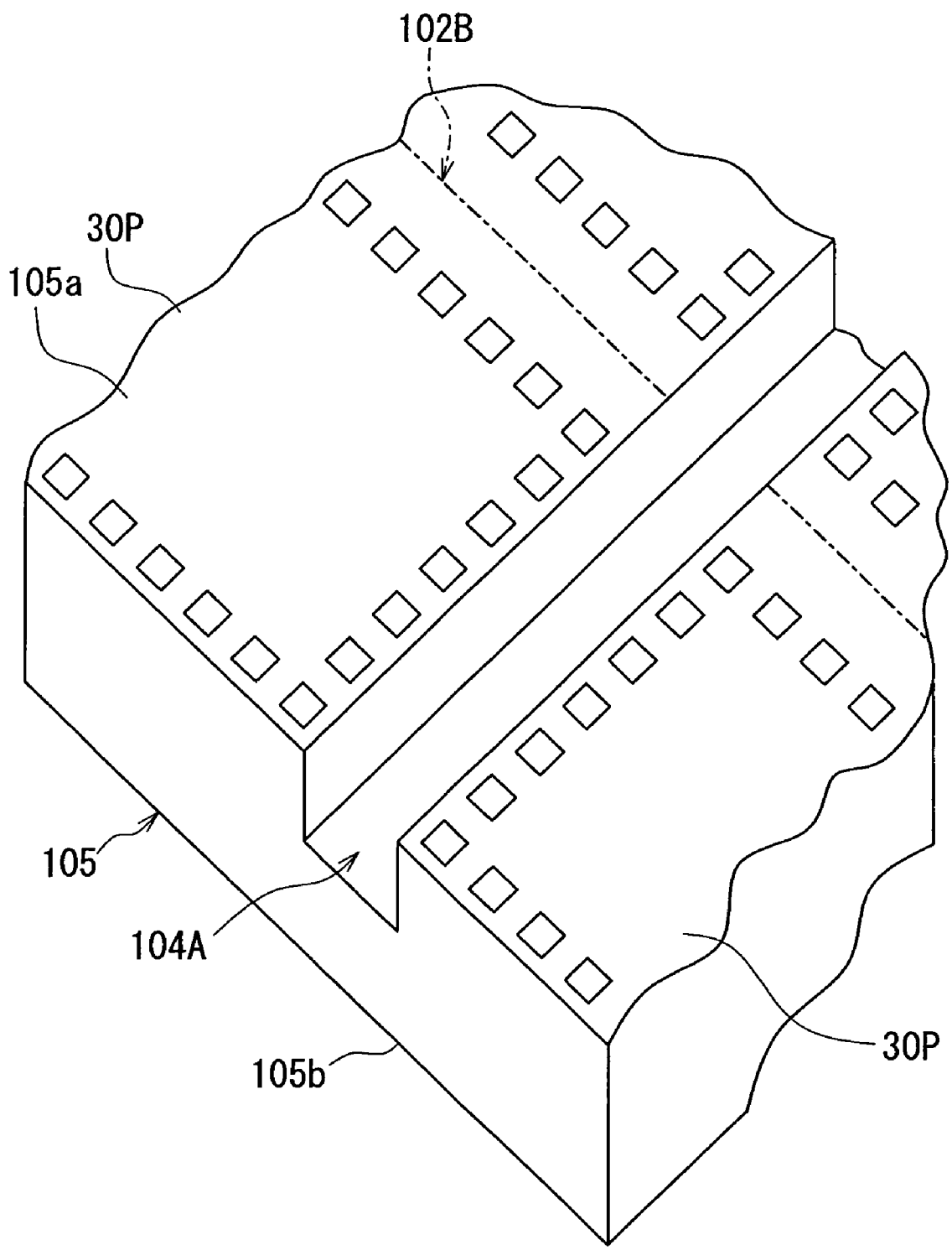
FIG. 35 is a perspective view of a portion of a pre-polishing substructure main body of the second embodiment of the invention.

Reference is now made to FIG. 35 to describe differences of the manufacturing method for the layered chip package 1 of the second embodiment from the method of the first embodiment. FIG. 35 shows a portion of the pre-polishing substructure main body 105 fabricated in the step of FIG. 6 according to the second embodiment. According to the second embodiment, in the step of FIG. 6, the plurality of first grooves 104A along the plurality of scribe lines 102A shown in FIG. 14 are only formed as the plurality of grooves 104. In other words, the plurality of second grooves 104B (see FIG. 16) along the plurality of scribe lines 102B are not formed in the second embodiment, although they are formed in the first embodiment. According to the second embodiment, in the step of FIG. 30 the main body aggregate 130 is cut along the scribe lines 102B, whereby the pre-semiconductor-chip portions 30P are separated from each other to become the semiconductor chips 30. By cutting the main body aggregate 130 along the scribe lines 102B, the third side surface $30e$ and the fourth side surface $30f$ of each semiconductor chip 30 are formed.

Compared with the first embodiment, the second embodiment allows an increase in proportion of the area occupied by the semiconductor chip 30 in each layer portion 10, and consequently allows the layered chip package 1 to achieve a higher level of integration. The remainder of configuration, function and effects of the second embodiment are similar to those of the first embodiment.

Third Embodiment

Figure 36:
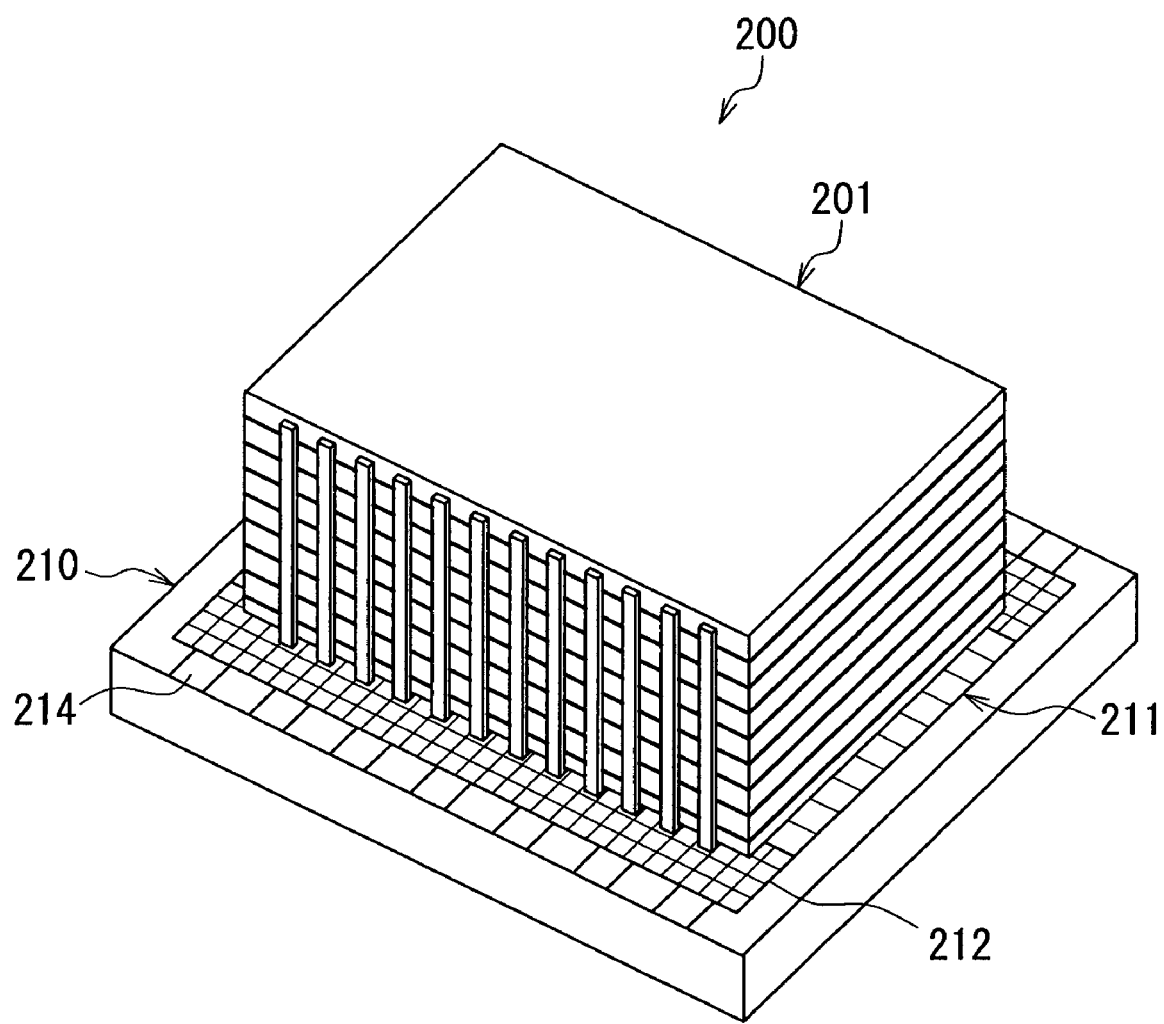
FIG. 36 is a perspective view of an electronic component of a third embodiment of the invention.
Figure 37:
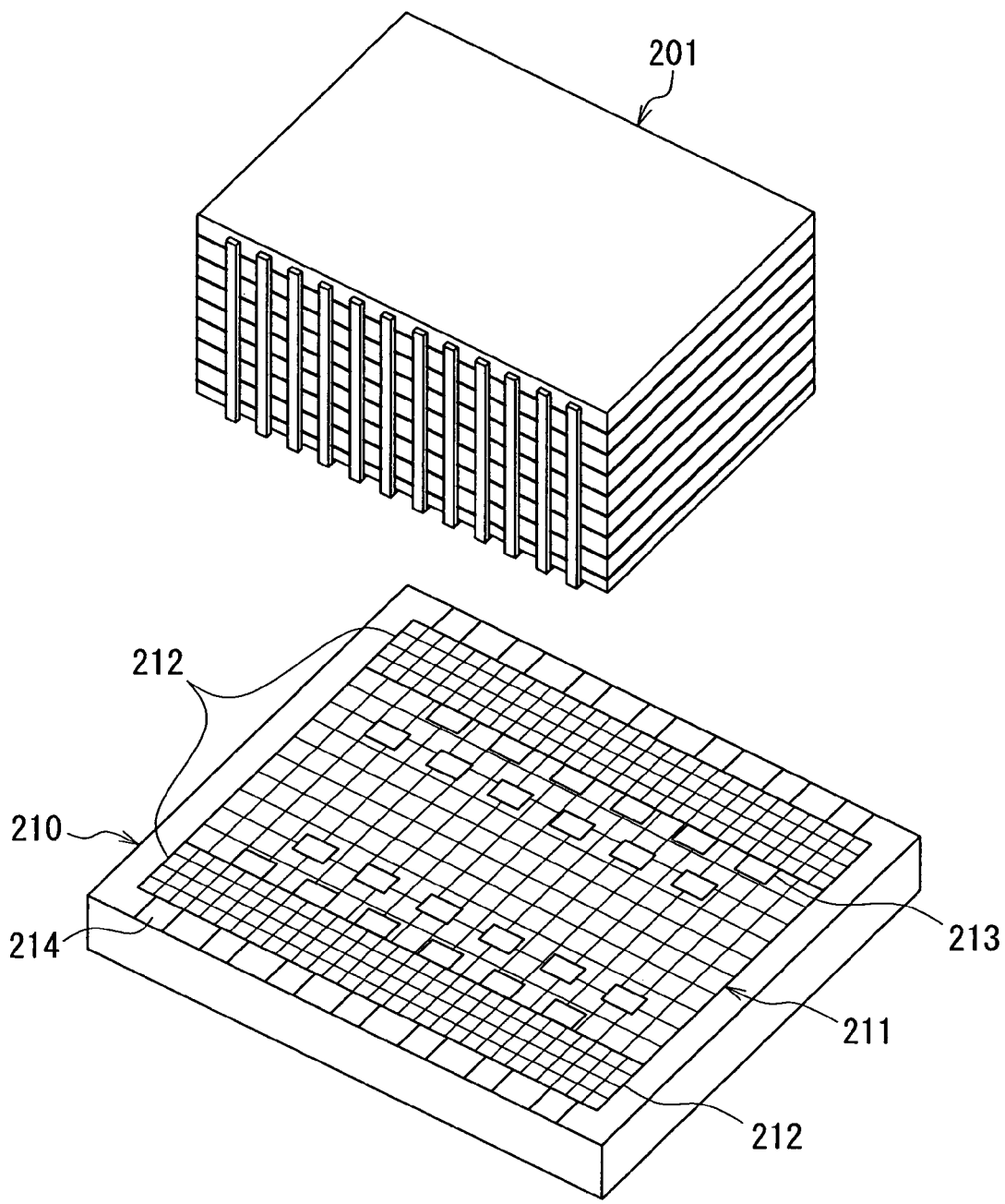
FIG. 37 is an exploded perspective view of the electronic component of FIG. 36.

A third embodiment of the present invention will now be described. Reference is now made to FIG. 36 to describe the configuration of an electronic component of the third embodiment. FIG. 36 is a perspective view of the electronic component of the third embodiment. FIG. 37 is an exploded perspective view of the electronic component of FIG. 36. The electronic component of the third embodiment implements a memory device such as a flash memory, DRAM, SRAM, MRAM, PROM or FeRAM.

As shown in FIG. 36 and FIG. 37, the electronic component 200 of the present embodiment includes a layered chip package 201, and a circuit layer 210 bonded to the layered chip package 201. In the layered chip package 201 of the present embodiment, all the layer portions 10 included in the main body 2 are the first-type layer portions. In other words, all the layer portions 10 each include the first-type semiconductor chip 30. The first-type semiconductor chip 30 includes a plurality of memory cells. The remainder of configuration of the layered chip package 201 is the same as that of the layered chip package 1 of the first or second embodiment.

The circuit layer 210 includes: a memory cell section 211 composed of a plurality of memory cells; and a control circuit 212 that controls writing and reading on and from memory cells included in the memory cell section 211 and in the plurality of layer portions 10 of the layered chip package 201. The circuit layer 210 further includes: a plurality of pad-shaped terminals 213 connected to the plurality of pad-shaped terminals 22 of the layered chip package 201; and a plurality of external connecting terminals 214. The pad-shaped terminals 213 and the external connecting terminals 214 are each connected to the control circuit 212. The planar shape of the circuit layer 210 is greater than that of each layer portion 10 of the layered chip package 201. The circuit layer 210 is formed by subjecting a semiconductor wafer to a wafer process.

The layered chip package 201 is placed on the circuit layer 210 such that the plurality of pad-shaped terminals 22 face downward, and the pad-shaped terminals 22 are connected to the pad-shaped terminals 213 by, for example, soldering. The circuit layer 210 is connected to the wiring 3 of the layered chip package 201 through the pad-shaped terminals 213 and 22. The control circuit 212 of the circuit layer 210 is thus electrically connected to the memory cells included in the memory cell section 211 of the circuit layer 210 and in the plurality of layer portions 10 of the layered chip package 1, so that a memory device is implemented by these components. The circuit layer 210 may include a control circuit that controls writing and reading on and from the memory cells included in the layer portions 10 of the layered chip package 201, without including the memory cell section 211.

Figure 38:
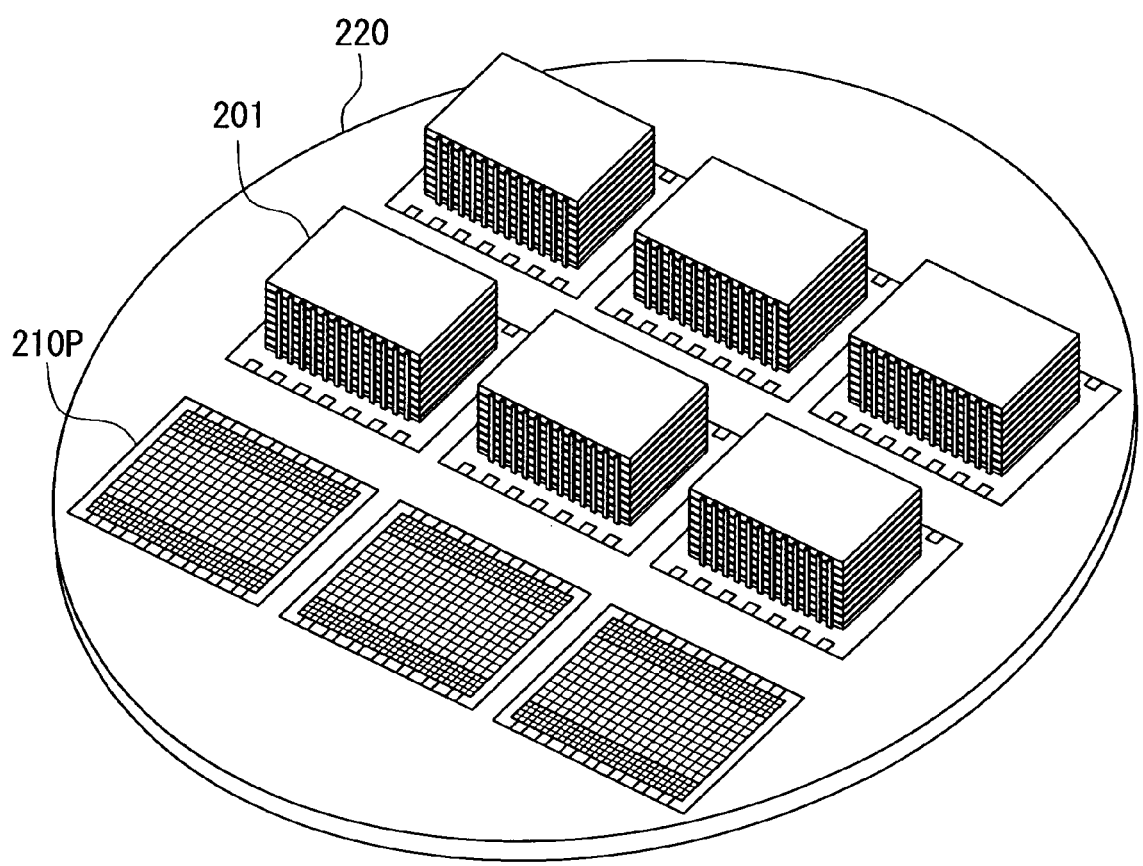
FIG. 38 is a perspective view showing the process of manufacturing the electronic component of the third embodiment of the invention.

Reference is now made to FIG. 38 to describe a manufacturing method for the electronic component 200 of the present embodiment. In this manufacturing method, as shown in FIG. 38, a circuit-layer wafer 220 including a plurality of pre-circuit-layer portions 210P aligned is fabricated by subjecting a semiconductor wafer to a wafer process. Each of the pre-circuit-layer portions 210P will later become the circuit layer 210. A plurality of layered chip packages 201 are also fabricated in this manufacturing method. The manufacturing method for the layered chip packages 201 is the same as that for the layered chip packages 1 of the first or second embodiment. Next, the plurality of layered chip packages 201 are respectively placed on the plurality of the pre-circuit-layer portions 210P and the pad-shaped terminals 22 are connected to the pad-shaped terminals 213 by, for example, soldering, whereby the layered chip packages 201 are electrically connected to and physically bonded to the pre-circuit-layer portions 210P, respectively. Next, the circuit-layer wafer 220 is cut with a dicing saw, for example, so that the plurality of pre-circuit-layer portions 210P are separated from each other to thereby become a plurality of circuit layers 210. In this way, a plurality of electronic components 200 each of which includes the circuit layer 210 and the layered chip package 201 are completed.

After a plurality of circuit layers 210 are formed by cutting the circuit-layer wafer 220, the layered chip packages 210 may be electrically connected to and physically bonded to the respective circuit layers 210 to thereby complete the electronic components 200.

Figure 39:
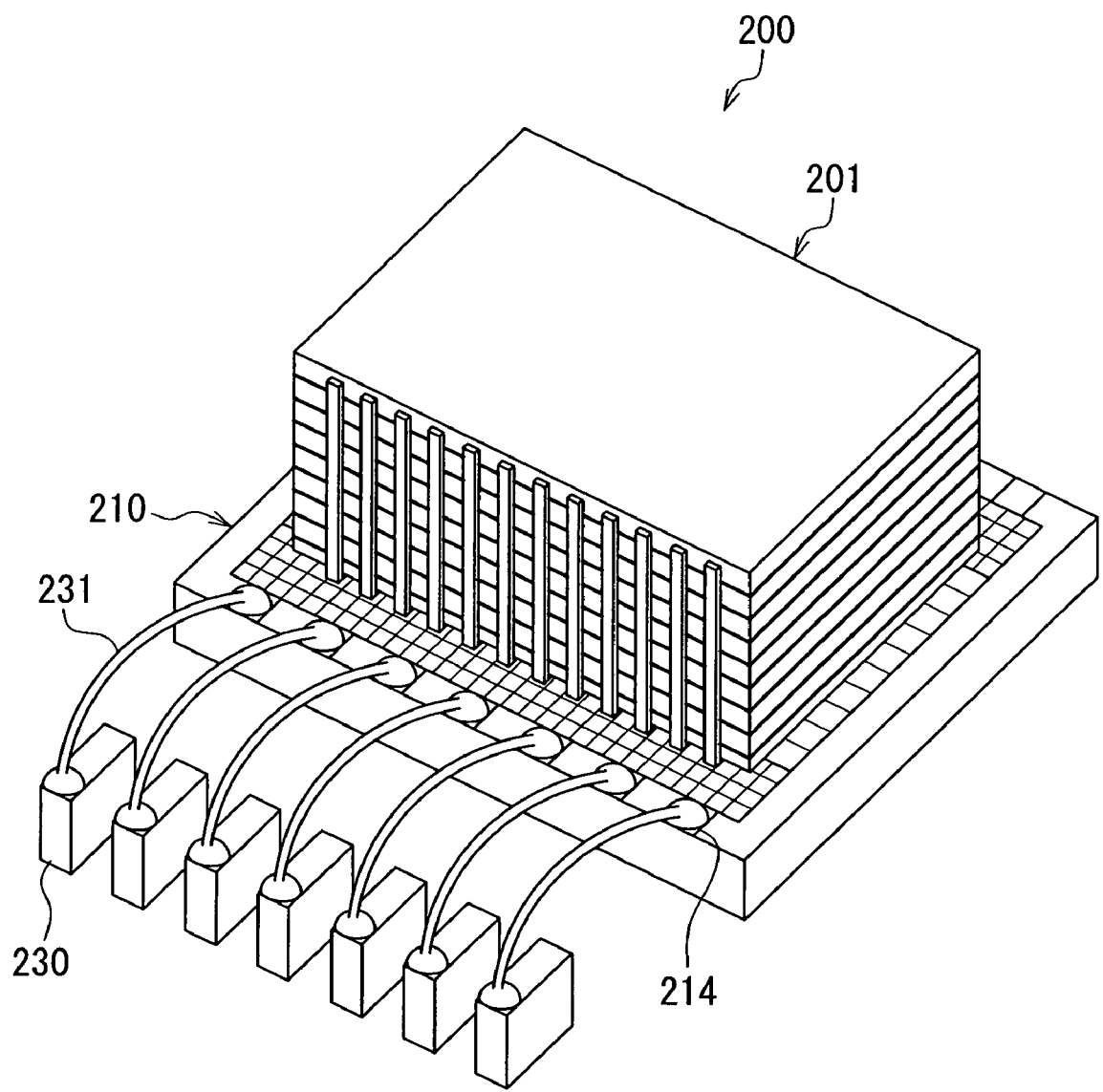
FIG. 39 is a perspective view showing an example of use of the electronic component of FIG. 36.

Reference is now made to FIG. 39 to describe an example of use of the electronic component 200. In the example shown in FIG. 39, bonding wires 231 are connected at one end to the plurality of external connecting terminals 214 of the circuit layer 210. The other end of each of the bonding wires 231 is connected to a terminal 230 of a device for use with the electronic component 200.

As described above, according to the present embodiment, a memory device is implemented by the circuit layer 210 and the layered chip package 201. According to the present embodiment, since electrical connection between the plurality of semiconductor chips 30 included in the layered chip package 201 is established through the wiring 3 disposed on at least one of the side surfaces of the main body 2, it is possible to easily form wiring for establishing electrical connection between the semiconductor chips 30 and to increase the reliability of the wiring.

The remainder of configuration, function and effects of the third embodiment are similar to those of the first or second embodiment.

Fourth Embodiment

Figure 40:
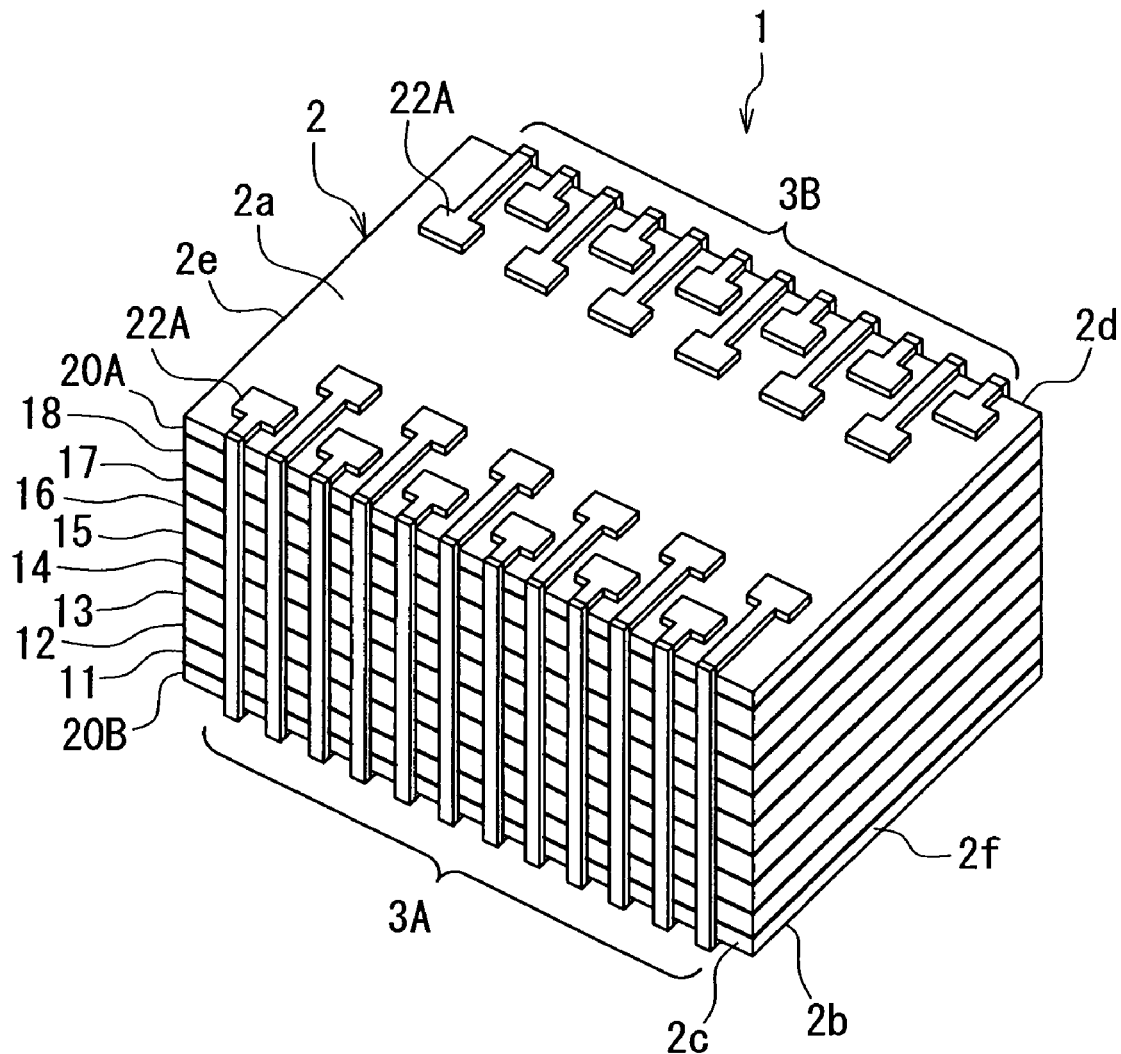
FIG. 40 is a perspective view of a layered chip package of a fourth embodiment of the invention.
Figure 41:
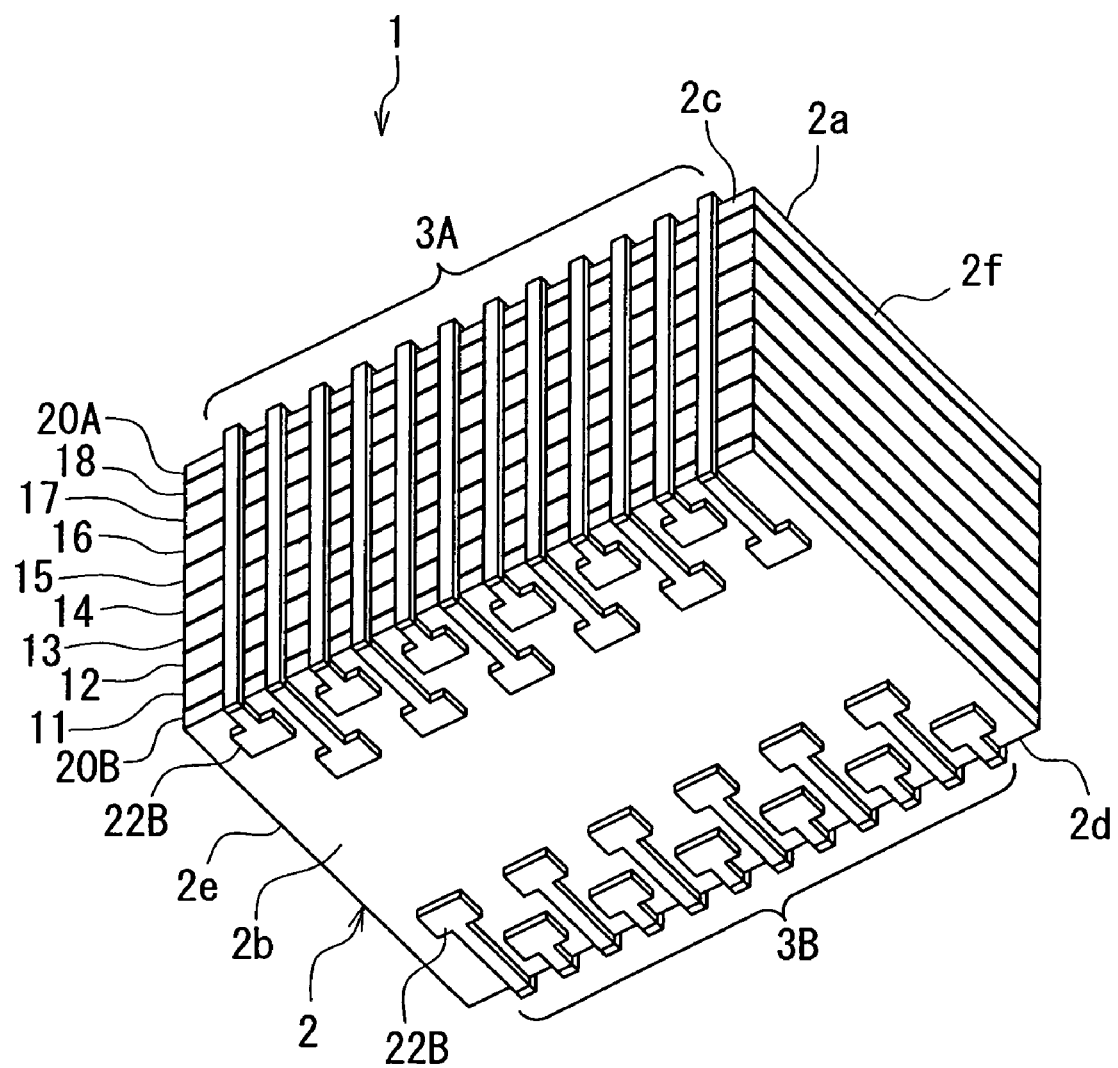
FIG. 41 is a perspective view of the layered chip package of FIG. 40 as seen from the bottom surface.

A fourth embodiment of the present invention will now be described with reference to FIG. 40 and FIG. 41. FIG. 40 is a perspective view of a layered chip package of the fourth embodiment. FIG. 41 is a perspective view of the layered chip package of FIG. 40 as seen from the bottom surface.

In the layered chip package 1 of the fourth embodiment, as shown in FIG. 40 and FIG. 41, the main body 2 includes a terminal layer 20A disposed on the uppermost layer portion 18, and a terminal layer 20B disposed below the lowermost layer portion 11. Every vertically adjacent two of the layer portions are bonded to each other with an adhesive, so are the layer portion 18 and the terminal layer 20A to each other, and so are the layer portion 11 and the terminal layer 20B to each other.

The terminal layer 20A includes a plurality of pad-shaped first terminals 22A disposed on the top surface 2a of the main body 2. The terminal layer 20B includes a plurality of pad-shaped second terminals 22B disposed on the bottom surface 2b of the main body 2. These terminals 22A and 22B function as external connecting terminals of the layered chip package 1.

Some of the first terminals 22A each have an end face located at the position corresponding to the side surface 2c of the main body 2, and the first wiring 3A is connected to this end face. Other some of the first terminals 22A each have an end face located at the position corresponding to the side surface 2d of the main body 2, and the second wiring 3B is connected to this end face.

Similarly, some of the second terminals 22B each have an end face located at the position corresponding to the side surface 2c of the main body 2, and the first wiring 3A is connected to this end face. Other some of the second terminals 22B each have an end face located at the position corresponding to the side surface 2d of the main body 2, and the second wiring 3B is connected to this end face.

The layered chip package 1 may further include: a first overcoat layer that is formed of an insulating material such as a resin and covers the top surface 2a of the main body 2 and the first terminals 22A; and a second overcoat layer that is formed of an insulating material such as a resin and covers the bottom surface 2b of the main body 2 and the second terminals 22B. In this case, a plurality of openings for exposing respective portions of the first terminals 22A are formed in the first overcoat layer, and a plurality of openings for exposing respective portions of the second terminals 22B are formed in the second overcoat layer.

The layered chip package 1 of the present embodiment is provided with the wring 3 disposed on at least one of the side surfaces of the main body 2, the plurality of first terminals 22A disposed on the top surface 2a of the main body 2, and the plurality of second terminals 22B disposed on the bottom surface 2b of the main body 2. This allows an increase in variety of electrical connection between a plurality of layered chip packages 1. According to the present embodiment, for example, it is possible to stack a plurality of layered chip packages 1 and electrically connect every vertically adjacent two of the layered chip packages 1 to each other using the first terminals 22A and the second terminals 22B. According to the present embodiment, for example, it is also possible to construct a module by mounting a plurality of layered chip packages 1 on a single wiring board, electrically connecting the layered chip packages 1 to the wiring board using the second terminals 22B, and providing wiring for electrically connecting the first terminals 22A of the layered chip packages 1 to each other. Thus, since the present embodiment allows an increase in variety of electrical connection between a plurality of layered chip packages 1, it becomes possible to achieve miniaturization of a system including a plurality of layered chip packages 1.

The remainder of configuration, function and effects of the fourth embodiment are similar to those of the first or second embodiment.

Fifth Embodiment

Figure 42:
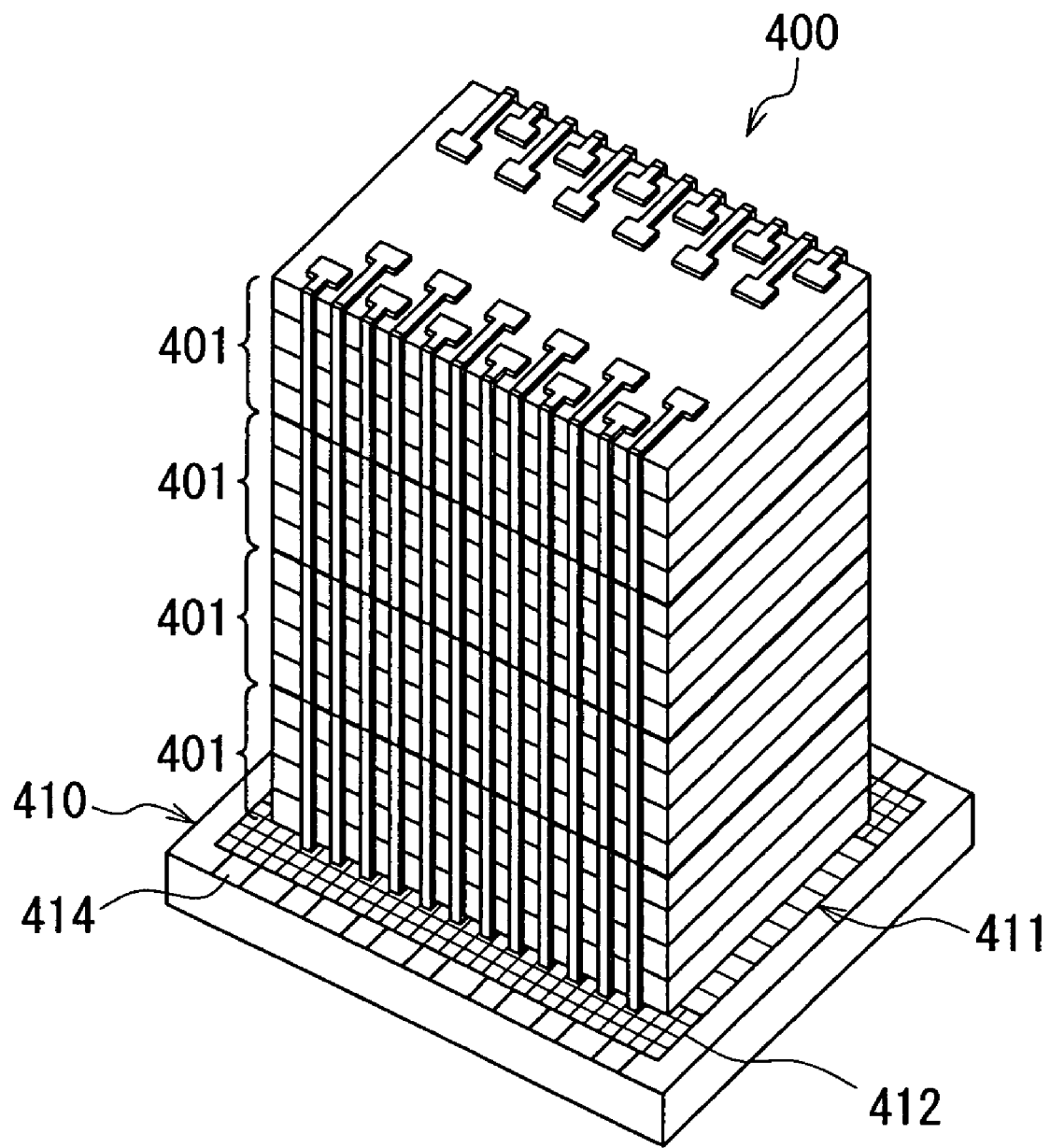
FIG. 42 is a perspective view showing a mode of an electronic component of a fifth embodiment of the invention.
Figure 43:
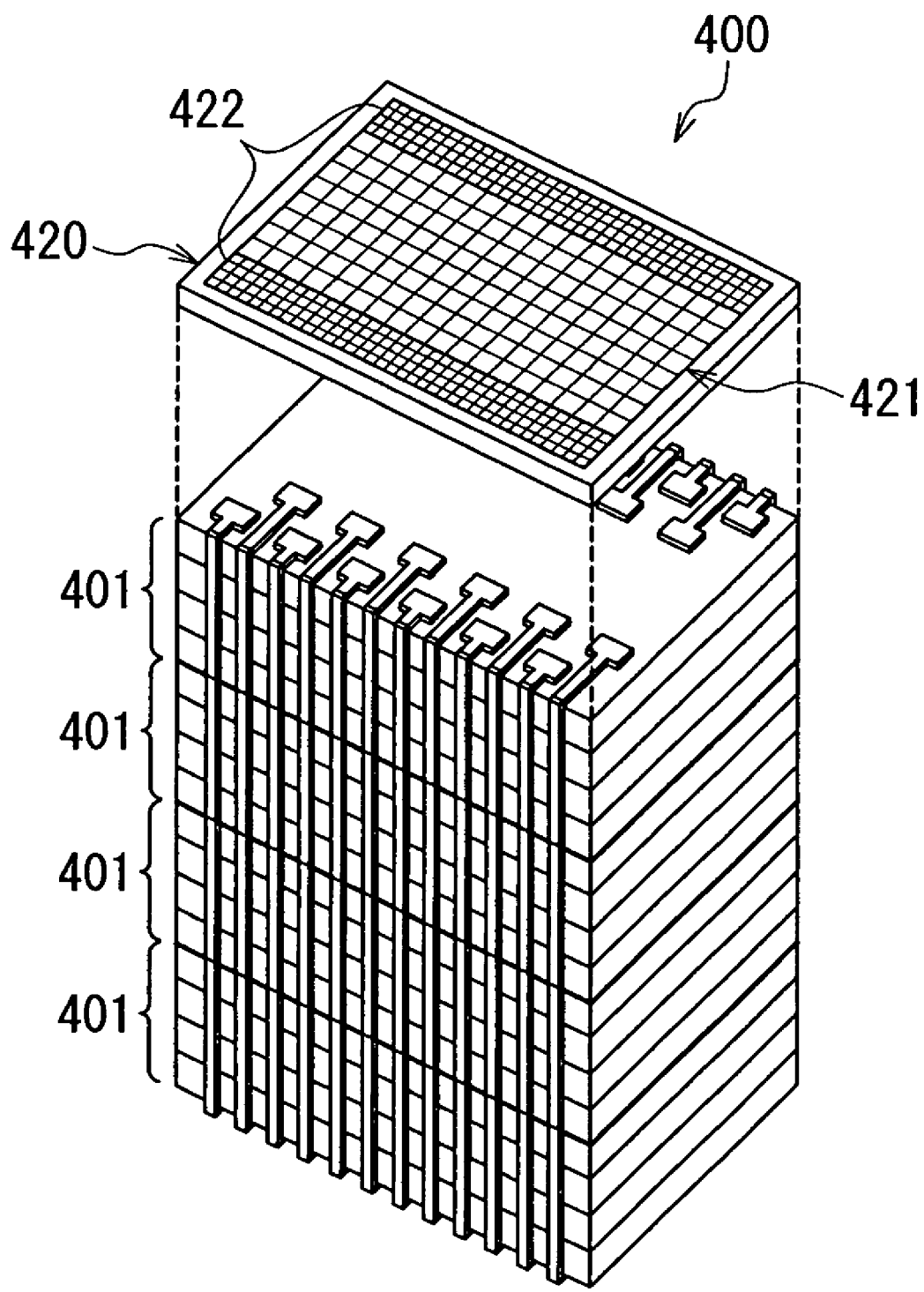
FIG. 43 is a perspective view showing another mode of the electronic component of the fifth embodiment of the invention.

A fifth embodiment of the present invention will now be described with reference to FIG. 42 and FIG. 43. FIG. 42 is a perspective view showing a mode of an electronic component of the fifth embodiment. FIG. 43 is a perspective view showing another mode of the electronic component of the fifth embodiment. The electronic component of the fifth embodiment implements a memory device such as a flash memory, DRAM, SRAM, MRAM, PROM, or FeRAM.

As shown in FIG. 42 and FIG. 43, the electronic component 400 of the present embodiment includes a plurality of layered chip packages 401 stacked, and a circuit layer bonded to and electrically connected to one of the plurality of layered chip packages 401. FIG. 42 shows an example in which four layered chip packages 401 are stacked and a circuit layer 410 is bonded to the bottom surface of the lowermost layered chip package 401. FIG. 43 shows an example in which four layered chip packages 401 are stacked and a circuit layer 420 is bonded to the top surface of the uppermost layered chip package 401.

In each of the layered chip packages 401 of the present embodiment, all the layer portions 10 included in the main body 2 are the first-type layer portions. In other words, in the present embodiment, all the layer portions 10 each include the first-type semiconductor chip 30. The first-type semiconductor chip 30 includes a plurality of memory cells. The remainder of configuration of each of the layered chip packages 401 is the same as that of the layered chip package 1 of the fourth embodiment. Thus, each of the layered chip packages 401 includes the plurality of pad-shaped first terminals 22A disposed on the top surface 2a of the main body 2, and the plurality of pad-shaped second terminals 22B disposed on the bottom surface 2b of the main body 2.

In every vertically adjacent two of the layered chip packages 401, the first terminals 22A of the lower one of the layered chip packages 401 are electrically connected to the second terminals 22B of the upper one of the layered chip packages 401 by, for example, soldering. Every vertically adjacent two of the layered chip packages 401 are thereby electrically connected to each other.

The configuration of the circuit layer 410 shown in FIG. 42 is the same as that of the circuit layer 210 of the third embodiment. Specifically, the circuit layer 410 includes: a memory cell section 411 composed of a plurality of memory cells; and a control circuit 412 that controls writing and reading on and from memory cells included in the memory cell section 411 and in the plurality of layered chip packages 401. The circuit layer 410 further includes a plurality of pad-shaped terminals (not shown) connected to the second terminals 22B of the layered chip package 401, and a plurality of external connecting terminals 414. The pad-shaped terminals and the external connecting terminals 414 are each connected to the control circuit 412. The planar shape of the circuit layer 410 is greater than that of each layer portion 10 of the layered chip packages 401. The circuit layer 410 is formed by subjecting a semiconductor wafer to a wafer process.

In the example shown in FIG. 42, the second terminals 22B of the lowermost layered chip package 401 are connected to the pad-shaped terminals of the circuit layer 410 by, for example, soldering. The circuit layer 410 is connected to the wiring 3 of the lowermost layered chip package 401 through the pad-shaped terminals and the second terminals 22B. The control circuit 412 of the circuit layer 410 is thus electrically connected to the memory cells included in the memory cell section 411 of the circuit layer 410 and in the plurality of layered chip packages 401, so that a memory device is implemented by these components. The circuit layer 410 may include a control circuit that controls writing and reading on and from the memory cells included in the plurality of layered chip packages 401, without including the memory cell section 411.

The circuit layer 420 shown in FIG. 43 includes: a memory cell section 421 composed of a plurality of memory cells; and a control circuit 422 that controls writing and reading on and from memory cells included in the memory cell section 421 and in the plurality of layered chip packages 401. The circuit layer 420 further includes a plurality of pad-shaped terminals (not shown) connected to the first terminals 22A of the layered chip package 401. The pad-shaped terminals are connected to the control circuit 422 and are exposed at the bottom surface of the circuit layer 420. The planar shape of the circuit layer 420 is the same as that of each layer portion 10 of the layered chip packages 401. The circuit layer 420 is formed by subjecting a semiconductor wafer to a wafer process.

In the example shown in FIG. 43, the first terminals 22A of the uppermost layered chip package 401 are connected to the pad-shaped terminals of the circuit layer 420 by, for example, soldering. The circuit layer 420 is connected to the wiring 3 of the uppermost layered chip package 401 through the pad-shaped terminals and the first terminals 22A. The control circuit 422 of the circuit layer 420 is thus electrically connected to the memory cells included in the memory cell section 421 of the circuit layer 420 and in the plurality of layered chip packages 401, so that a memory device is implemented by these components. The circuit layer 420 may include a control circuit that controls writing and reading on and from the memory cells included in the plurality of layered chip packages 401, without including the memory cell section 421.

According to the present embodiment, it is possible to easily implement memory devices of various capacities by changing the number of the layered chip packages 401 to be stacked.

The remainder of configuration, function and effects of the fifth embodiment are similar to those of the third or fourth embodiment.

The present invention is not limited to the foregoing embodiments but can be carried out in various modifications. For example, while in the first embodiment a plurality of main body aggregates 130 are arranged and then the wiring 3 is formed for the pre-main-body portions 2P of the plurality of main body aggregates 130 at a time, the wiring 3 may be formed for the pre-main-body portions 2P of a single main body aggregate 130 without arranging a plurality of main body aggregates 130.

In addition, after the main body 2 is formed by cutting the main body aggregate 130 having undergone the formation of the wiring 3, another wiring may be formed on a surface formed for the main body 2 as a result of cutting the main body aggregate 130.

In addition, the main body 2 of the layered chip package may be without the terminal layer, and part of the wiring 3 may also function as external connecting terminals.

It is apparent that the present invention can be carried out in various forms and modifications in the light of the foregoing descriptions. Accordingly, within the scope of the following claims and equivalents thereof, the present invention can be carried out in forms other than the foregoing most preferred embodiments.

What is claimed is:

1. A layered chip package comprising:
  a main body having a top surface, a bottom surface and four side surfaces; and
  wiring disposed on at least one of the side surfaces of the main body, wherein:
  the main body includes a plurality of layer portions stacked;
  the plurality of layer portions include: a plurality of first-type layer portions each including a first-type semiconductor chip; and a second-type layer portion including a second-type semiconductor chip;

the first-type semiconductor chip includes a plurality of memory cells;

the second-type semiconductor chip includes a circuit that controls writing and reading on and from the plurality of memory cells included in the plurality of first-type layer portions;

each of the first-type semiconductor chip and the second-type semiconductor chip has a top surface, a bottom surface and four side surfaces;

each of the plurality of layer portions includes: an insulating portion covering at least one of the four side surfaces of the first-type or second-type semiconductor chip; and a plurality of electrodes connected to the first-type or second-type semiconductor chip;

the insulating portion has at least one end face located at the at least one of the side surfaces of the main body on which the wiring is disposed;

each of the plurality of electrodes has an end face surrounded by the insulating portion and located at the at least one of the side surfaces of the main body on which the wiring is disposed; and the wiring is connected to the end faces of the plurality of electrodes of the plurality of layer portions.

2. The layered chip package according to claim 1, wherein the first-type semiconductor chip further includes a circuit relating only to the plurality of memory cells included therein.

3. The layered chip package according to claim 1, further comprising a plurality of terminals disposed on at least one of the top surface and the bottom surface of the main body and connected to the wiring.

4. The layered chip package according to claim 1, wherein:

the four side surfaces of the main body include at least one first-type side surface on which the wiring is disposed, and at least one second-type side surface on which the wiring is not disposed; and the four side surfaces of the first-type or second-type semiconductor chip include at least one first-type side surface having the insulating portion between itself and the at least one first-type side surface of the main body, and at least one second-type side surface located at the at least one second-type side surface of the main body.

5. An electronic component comprising: a layered chip package; and a circuit layer bonded to the layered chip package, wherein:

the layered chip package comprises: a main body having a top surface, a bottom surface and four side surfaces; and wiring disposed on at least one of the side surfaces of the main body;

the main body includes a plurality of layer portions stacked;

each of the plurality of layer portions includes: a semiconductor chip having a top surface, a bottom surface and four side surfaces and including a plurality of memory cells; an insulating portion covering at least one of the four side surfaces of the semiconductor chip; and a plurality of electrodes connected to the semiconductor chip;

the insulating portion has at least one end face located at the at least one of the side surfaces of the main body on which the wiring is disposed;

each of the plurality of electrodes has an end face surrounded by the insulating portion and located at the at least one of the side surfaces of the main body on which the wiring is disposed;

the wiring is connected to the end faces of the plurality of electrodes of the plurality of layer portions; and the circuit layer includes a circuit that is connected to the wiring of the layered chip package and that controls writing and reading on and from the plurality of memory cells included in the plurality of layer portions.

6. The electronic component according to claim 5, wherein the semiconductor chip further includes a circuit relating only to the plurality of memory cells included therein.

7. The electronic component according to claim 5, wherein the layered chip package further comprises a plurality of terminals disposed on at least one of the top surface and the bottom surface of the main body and connected to the wiring, and the circuit layer is connected to the plurality of terminals.

8. The electronic component according to claim 5, wherein:

the four side surfaces of the main body include at least one first-type side surface on which the wiring is disposed, and at least one second-type side surface on which the wiring is not disposed; and the four side surfaces of the semiconductor chip include at least one first-type side surface having the insulating portion between itself and the at least one first-type side surface of the main body, and at least one second-type side surface located at the at least one second-type side surface of the main body.

9. An electronic component comprising: a plurality of layered chip packages stacked; and a circuit layer bonded to and electrically connected to one of the plurality of layered chip packages, wherein:

every vertically adjacent two of the layered chip packages are electrically connected to each other;

each of the plurality of layered chip packages comprises: a main body having a top surface, a bottom surface and four side surfaces; and wiring disposed on at least one of the side surfaces of the main body;

the main body includes a plurality of layer portions stacked;

each of the plurality of layer portions includes: a semiconductor chip having a top surface, a bottom surface and four side surfaces and including a plurality of memory cells; an insulating portion covering at least one of the four side surfaces of the semiconductor chip; and a plurality of electrodes connected to the semiconductor chip;

the insulating portion has at least one end face located at the at least one of the side surfaces of the main body on which the wiring is disposed;

each of the plurality of electrodes has an end face surrounded by the insulating portion and located at the at least one of the side surfaces of the main body on which the wiring is disposed;

the wiring is connected to the end faces of the plurality of electrodes of the plurality of layer portions; and the circuit layer includes a circuit that controls writing and reading on and from the plurality of memory cells included in the plurality of layered chip packages.

10. The electronic component according to claim 9, wherein the semiconductor chip further includes a circuit relating only to the plurality of memory cells included therein.

11. The electronic component according to claim 9, wherein:

each of the plurality of layered chip packages further comprises: a plurality of first terminals disposed on the top surface of the main body and connected to the wiring;

and a plurality of second terminals disposed on the bottom surface of the main body and connected to the wiring; and in every vertically adjacent two of the layered chip packages, the plurality of first terminals of the lower one of the layered chip packages are electrically connected to the plurality of second terminals of the upper one of the layered chip packages.

12. The electronic component according to claim 9, wherein:

the four side surfaces of the main body include at least one first-type side surface on which the wiring is disposed, and at least one second-type side surface on which the wiring is not disposed; and the four side surfaces of the semiconductor chip include at least one first-type side surface having the insulating portion between itself and the at least one first-type side surface of the main body, and at least one second-type side surface located at the at least one second-type side surface of the main body.

* * * * *